United States Patent
Kim et al.

(10) Patent No.: US 10,310,685 B2
(45) Date of Patent: Jun. 4, 2019

(54) TOUCH SCREEN PANEL, METHOD OF MANUFACTURING TOUCH SCREEN PANEL, AND TOUCH DISPLAY DEVICE INCLUDING TOUCH SCREEN PANEL

(71) Applicant: Samsung Display Co., Ltd., Yongin-si (KR)

(72) Inventors: SangGab Kim, Seoul (KR); Ji Hun Kim, Hwaseong-si (KR); Yu-Gwang Jeong, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 241 days.

(21) Appl. No.: 15/359,624

(22) Filed: Nov. 23, 2016

(65) Prior Publication Data

US 2017/0168608 A1 Jun. 15, 2017

(30) Foreign Application Priority Data

Dec. 11, 2015 (KR) .................. 10-2015-0177142

(51) Int. Cl.
  *G06F 3/044* (2006.01)
  *G06F 3/041* (2006.01)
  *H01L 27/32* (2006.01)

(52) U.S. Cl.
  CPC ............ *G06F 3/044* (2013.01); *G06F 3/0412* (2013.01); *G06F 2203/04103* (2013.01); *G06F 2203/04112* (2013.01); *H01L 27/323* (2013.01)

(58) Field of Classification Search
  CPC . G06F 2203/04103; G06F 2203/04112; G06F 3/0412; G06F 3/044; H01L 27/323
  See application file for complete search history.

(56) References Cited

U.S. PATENT DOCUMENTS

| 9,229,137 B2 | 1/2016 | Takakuwa et al. |
| 2009/0219257 A1* | 9/2009 | Frey ................ G06F 3/044 345/173 |
| 2013/0082970 A1* | 4/2013 | Frey ................ G06F 3/0414 345/173 |

(Continued)

FOREIGN PATENT DOCUMENTS

| CN | 104777659 | 7/2015 |
| CN | 104777660 | 7/2015 |

(Continued)

OTHER PUBLICATIONS

Hsu, et al, "Performance enhancement of metal nanowire transparent conducting electrodes by mesoscale metal wires," Nature Communications, Sep. 25, 2013, pp. 1-7, vol. 4, Macmillan Publishers Limited.

(Continued)

*Primary Examiner* — Viet D Pham
(74) *Attorney, Agent, or Firm* — H.C. Park & Associates, PLC

(57) ABSTRACT

A touch screen panel includes: a first touch electrode disposed on a substrate and extending in a first direction, the first touch electrode including first mesh patterns formed of crossing metal wirings including fine patterns; and a second touch electrode disposed on the substrate and extending in a second direction crossing the first direction, the second touch electrode including second mesh patterns formed of crossing of metal wirings including fine patterns.

32 Claims, 22 Drawing Sheets

(56) References Cited

U.S. PATENT DOCUMENTS

| | | |
|---|---|---|
| 2014/0022467 A1* | 1/2014 | Chai .................. G02F 1/13338 349/12 |
| 2014/0111711 A1* | 4/2014 | Iwami ..................... B32B 7/02 349/12 |
| 2015/0016070 A1 | 1/2015 | Chang |
| 2015/0052747 A1 | 2/2015 | Lin |
| 2015/0062497 A1 | 3/2015 | Nam et al. |
| 2015/0070762 A1 | 3/2015 | An et al. |
| 2015/0090395 A1* | 4/2015 | Lin ....................... G06F 1/1692 156/239 |
| 2015/0103263 A1 | 4/2015 | Han et al. |
| 2015/0108688 A1 | 4/2015 | Shin et al. |
| 2015/0138452 A1 | 5/2015 | Petcavich |
| 2015/0162390 A1 | 6/2015 | Wang et al. |
| 2015/0198833 A1 | 7/2015 | Chung et al. |
| 2015/0198845 A1 | 7/2015 | Lee et al. |
| 2015/0224704 A1 | 8/2015 | Cho et al. |
| 2015/0314323 A1 | 11/2015 | Park et al. |
| 2015/0346866 A1 | 12/2015 | Kusunoki et al. |
| 2015/0370357 A1* | 12/2015 | Hsu ........................ G06F 3/044 345/173 |
| 2016/0026034 A1 | 1/2016 | Nam et al. |
| 2016/0041649 A1* | 2/2016 | Uchida .................. G06F 3/044 345/174 |
| 2016/0077262 A1 | 3/2016 | Takakuwa |
| 2016/0114502 A1 | 4/2016 | Han et al. |
| 2016/0116798 A1 | 4/2016 | Nam et al. |
| 2016/0200033 A1 | 7/2016 | Lee et al. |
| 2016/0202550 A1 | 7/2016 | Lee et al. |
| 2016/0342247 A1 | 11/2016 | Jin et al. |

FOREIGN PATENT DOCUMENTS

| | | |
|---|---|---|
| DE | 102015210047 | 12/2015 |
| EP | 2048672 | 4/2009 |
| EP | 2738653 | 6/2014 |
| EP | 2854000 | 4/2015 |
| KR | 1020150027931 | 3/2015 |
| KR | 1020150029817 | 3/2015 |
| KR | 1020150039639 | 4/2015 |
| KR | 1020150045042 | 4/2015 |
| KR | 1020150085161 | 7/2015 |
| KR | 1020150095971 | 8/2015 |
| KR | 1020150113438 | 10/2015 |
| KR | 1020160014201 | 2/2016 |
| KR | 1020160031615 | 3/2016 |
| KR | 1020160049162 | 5/2016 |
| KR | 1020160085948 | 7/2016 |
| KR | 1020160085949 | 7/2016 |

OTHER PUBLICATIONS

Extended European Search Report dated Apr. 20, 2017, in European Patent Application No. 16202336.0.

* cited by examiner

TOUCH SCREEN PANEL, METHOD OF MANUFACTURING TOUCH SCREEN PANEL, AND TOUCH DISPLAY DEVICE INCLUDING TOUCH SCREEN PANEL

CROSS-REFERENCE TO RELATED APPLICATION

This application claims priority from and the benefit of Korean Patent Application No. 10-2015-0177142, filed on Dec. 11, 2015, which is hereby incorporated by reference for all purposes as if fully set forth herein.

BACKGROUND

Field

Exemplary embodiments relate to a touch screen panel, method of manufacturing the touch screen panel and a touch display device including the touch screen panel.

Discussion of the Background

As demands on various types of display devices have increased with the development of an information society, studies on display devices, such as liquid crystal display devices, plasma display panels, field emission display devices, electrophoretic display devices, organic light emitting display devices, and the like, have been conducted. These studies have given rise to an ability to apply a touch screen panel function to such display devices. A touch screen panel is an input device that enables a command to be input by touching (or almost touching) a screen of a display device using an object, such as a finger, pen, etc. In this manner, a touch screen panel can substitute for a separate input device connected to a display device, such as a keyboard, mouse, and the like.

Touch screen panels may be resistive overlay touch screen panels, photosensitive touch screen panels, capacitive touch screen panels, and the like. Among the various types of touch screen panels, capacitive touch screen panels are configured to convert information regarding a position(s) of a touch interaction into an electrical signal by sensing a change in capacitance formed between a conductive sensing pattern and an adjacent sensing pattern, ground electrode, or the like, when an object, such as a user appendage, pen, etc., comes in contact with (or almost contacts, e.g., hovers above) the touch screen panel.

Generally, a touch electrode of a touch screen panel may be formed of a transparent conductive material, such as indium tin oxide (ITO). It is noted, however, that ITO is relatively expensive, and, as such, manufacturing costs increase with the use of ITO. As such, a touch electrode using opaque metal mesh patterns are of interest because opaque metal mesh patterns typically have a relatively high electrical conductivity and are less expensive than ITO. Metal mesh patterns, however, typically have a fine thickness and may be damaged as a result of an external impact. The "damage" may be recognized (viewed by an observer) as a stain on an accompanying display device due to reflectivity differences of damaged metal.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide a touch screen panel configured to prevent (or decrease) defects.

One or more exemplary embodiments provide a method of manufacturing the touch screen panel configured to prevent (or decrease) defects.

One or more exemplary embodiments provide a touch display device including the touch screen panel configured to prevent (or decrease) defects.

Additional aspects will be set forth in the detailed description which follows, and, in part, will be apparent from the disclosure, or may be learned by practice of the inventive concept.

According to one or more exemplary embodiments, a touch screen panel includes: a first touch electrode disposed on a substrate and extending in a first direction, the first touch electrode including first mesh patterns formed of crossing metal wirings including fine patterns; and a second touch electrode disposed on the substrate and extending in a second direction crossing the first direction, the second touch electrode including second mesh patterns formed of crossing of metal wirings including fine patterns.

According to one or more exemplary embodiments, a touch display device includes: a display panel configured to display an image; and a touch screen panel disposed on the display panel. The touch screen panel includes: a first touch electrode disposed on a substrate and extending in a first direction, the first touch electrode including first mesh patterns formed of crossing metal wirings including fine patterns; and a second touch electrode disposed on the substrate and extending in a second direction crossing the first direction, the second touch electrode including second mesh patterns formed of crossing of metal wirings including fine patterns.

According to one or more exemplary embodiments, a method of manufacturing a touch screen panel includes: forming a first protection layer on a substrate; forming, on the first protection layer, a first touch electrode extending in a first direction, the first touch electrode including first mesh patterns formed of crossing metal wirings comprising fine patterns; forming, on the first protection layer, a second touch electrode extending in a second direction crossing the first direction, the second touch electrode including second mesh patterns formed of crossing metal wirings including fine patterns; and forming a second protection layer on the first touch electrode and the second touch electrode.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
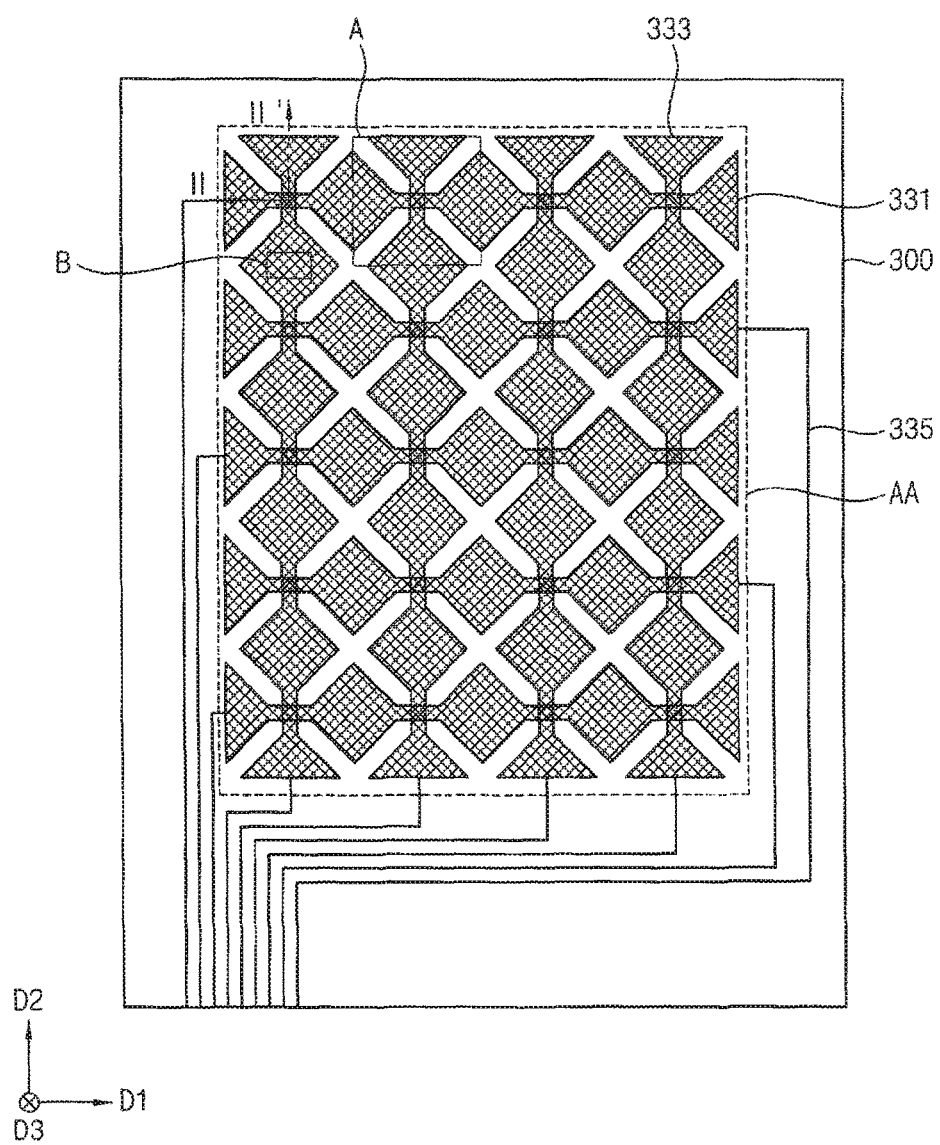
FIG. 1 is a plan view of a touch screen panel, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the D1-axis, the D2-axis, and the D3-axis are not limited to three axes of a rectangular coordinate system, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
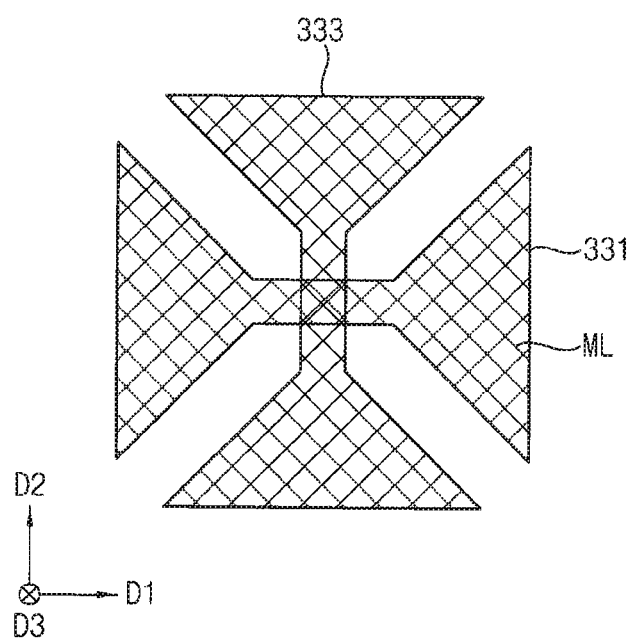
FIG. 2 is an enlarged plan view of portion "A" of FIG. 1, according to one or more exemplary embodiments.
Figure 8:
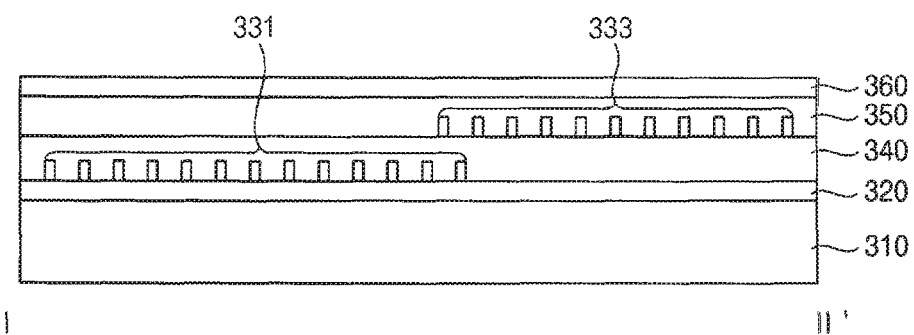
FIG. 8 is a cross-sectional view of the touch screen panel of FIG. 1 taken along sectional line II-II', according to one or more exemplary embodiments.

FIG. 1 is a plan view of a touch screen panel, according to one or more exemplary embodiments. FIG. 2 is an enlarged plan view of portion "A" of FIG. 1, according to one or more exemplary embodiments. FIG. 8 is a cross-sectional view of the touch screen panel of FIG. 1 taken along sectional line II-II', according to one or more exemplary embodiments.

Referring to FIGS. 1, 2, and 8, a touch screen panel 300 may include a base substrate 310, a first protection layer 320, a first insulation layer 340, a second insulation layer 350, a second protection layer 360, a first touch electrode 331, a second touch electrode 333, and a connecting wiring 335.

The base substrate 310 may be a transparent substrate. The base substrate 310 is made of a flexible material, such as made of a material selected from a group consisting of flexible polyethylene terephthalate (PET), polycarbonate (PC), polyethylene (PE), polyvinyl chloride (PVC), polypropylene (PP), polystyrene (PS), and polymethyl methacrylate methyl ester (PMMA). For example, the base substrate 310 may include polycarbonate (PC) and the base substrate 310 may be a circular polarizing film having a λ/4 phase difference. The base substrate 310 may be an upper substrate of a display panel of a display device. It is also contemplated that the base substrate 310 may be a separate substrate attached to the display panel.

The first protection layer 320 is disposed on the base substrate 310. The first protection layer 320 may include at least one of a material selected from the group consisting of silicon oxide ($SiO_x$), silicon nitride ($SiN_x$), and aluminum oxide ($AlO_x$). In addition, the first protection layer 320 may include a first layer including an organic material and a second layer overlapping the first layer and including silicon oxide ($SiO_x$). A refractive index of the first protection layer 320 may be more than 1.7 and less than 1.8. A thickness of the first protection layer 320 may be more than 50 nm and less than 150 nm. A refractive index of the first protection layer 320 may be different from a refractive index of the second protection layer 360.

The first protection layer 320 is disposed on the base substrate 310, and, as such, the first protection layer 320 prevents damage to the base substrate 310. In addition, the first protection layer 320 and the second protection layer 360 may compensate for decreasing of transmissivity due to refractive index differences between the first and second touch electrodes 331 and 333 and the first and second insulation layers 340 and 350.

The first touch electrode 331 is disposed on the first protection layer 320. The first touch electrode 331 extends in a first direction D 1. The first touch electrode 331 may include a plurality of first mesh patterns formed by crossings of metal wirings ML. The metal wirings ML are described later with reference to FIGS. 3 and 4. In one or more exemplary embodiments, the first mesh patterns may have a rhombus shape; however, exemplary embodiments are not limited thereto. The first mesh patterns may be formed by crossings of metal wirings ML.

The metal wirings ML of the first mesh patterns may be formed of a relatively low-resistance metallic material. The metallic material used for the metal wirings ML may include a relatively low-resistance metallic material, such as copper (Cu), aluminum (Al), molybdenum (Mo), titanium (Ti), silver (Ag), gold (Au), nickel (Ni), chromium (Cr), iron (Fe), indium (In), and gallium (Ga).

The first insulation layer 340 is formed on the first touch electrode 331. The first insulation layer 340 may include an inorganic material, such as silicon oxide ($SiO_x$) and/or silicon nitride ($SiN_x$). For example, the first insulation layer 340 includes silicon oxide ($SiO_x$), and may have a thickness of about 500 Å. In addition, the first insulation layer 340 may include a plurality of layers including different materials from each other or different materials from at least one other layer of the first insulation layer 340.

The second touch electrode 333 is disposed on the first insulation layer 340. The second touch electrode 333 extends in a second direction D2 crossing the first direction D1. The second touch electrode 333 may include a plurality of second mesh patterns formed by crossings of metal wirings ML. The metal wirings ML are described in more detail with reference to FIGS. 3 and 4. In one or more exemplary embodiments, the second mesh patterns may have a rhombus shape, however, exemplary embodiments are not limited thereto. The second mesh patterns may be formed by crossing of metal wirings ML. The metal wirings ML of the second mesh patterns may be formed of a relatively low-resistance metallic material. The metallic material used for the metal wirings ML may include a relatively low-resistance metallic material, such as copper (Cu), aluminum (Al), molybdenum (Mo), titanium (Ti), silver (Ag), gold (Au), nickel (Ni), chromium (Cr), iron (Fe), indium (In), and gallium (Ga).

The second insulation layer 350 is formed on the second touch electrode 333. The second insulation layer 350 may include an inorganic material, such as silicon oxide ($SiO_x$) and/or silicon nitride ($SiN_x$). For example, the second insulation layer 350 includes silicon oxide ($SiO_x$), and may have a thickness of about 500 Å. In addition, the second insulation layer 350 may include a plurality of layers including different materials from each other or different from at least one other layer of the second insulation layer 350.

The second protection layer 360 is disposed on the second insulation layer 350. The second protection layer 360 may include at least one of a material selected from the group consisting of silicon oxide ($SiO_x$), silicon nitride ($SiN_x$), and aluminum oxide ($AlO_x$). In addition, the second protection layer 360 may include a plurality of layers including different materials from each other or different from at least one other layer of the second protection layer 360. A refractive index of the second protection layer 360 may be more than 1.6 and less than 1.75. A thickness of the second protection layer 360 may be more than 50 nm and less than 150 nm. A refractive index of the second protection layer 360 may be different from a refractive index of the first protection layer 320. The second protection layer 360 and the first protection layer 320 may compensate for decreasing of transmissivity due to refractive index differences between the first and second touch electrodes 331 and 333 and the first and second insulation layers 340 and 350.

The touch electrodes 331 and 333 are alternately arranged. The first touch electrodes 331 are connected to one another to form a row having the same X coordinate, and the second touch electrodes 333 are connected to one another to form a column having the same Y coordinate. The touch screen panel may be a capacitive touch screen panel in which the first touch electrode 331 and the second touch electrode 333 are alternately distributed and arranged in an active area AA. The first touch electrode 331 and the second touch electrode 333 are connected to connecting wirings 335, respectively. The connecting wirings may be disposed outside of the active area AA.

The touch screen panel, according to one or more exemplary embodiments, is a capacitive touch screen panel. If the touch screen panel is contacted by (or almost contacted by) a contact object, such as a user's finger, stylus pen, etc., a change in capacitance caused by the touch interaction is provided to an external driving circuit (not shown) through the connecting wirings 335. The change in capacitance is converted into an electrical signal by an X and Y input processing circuit (not shown), or the like, so that the touch interaction position is detected.

Figure 3:
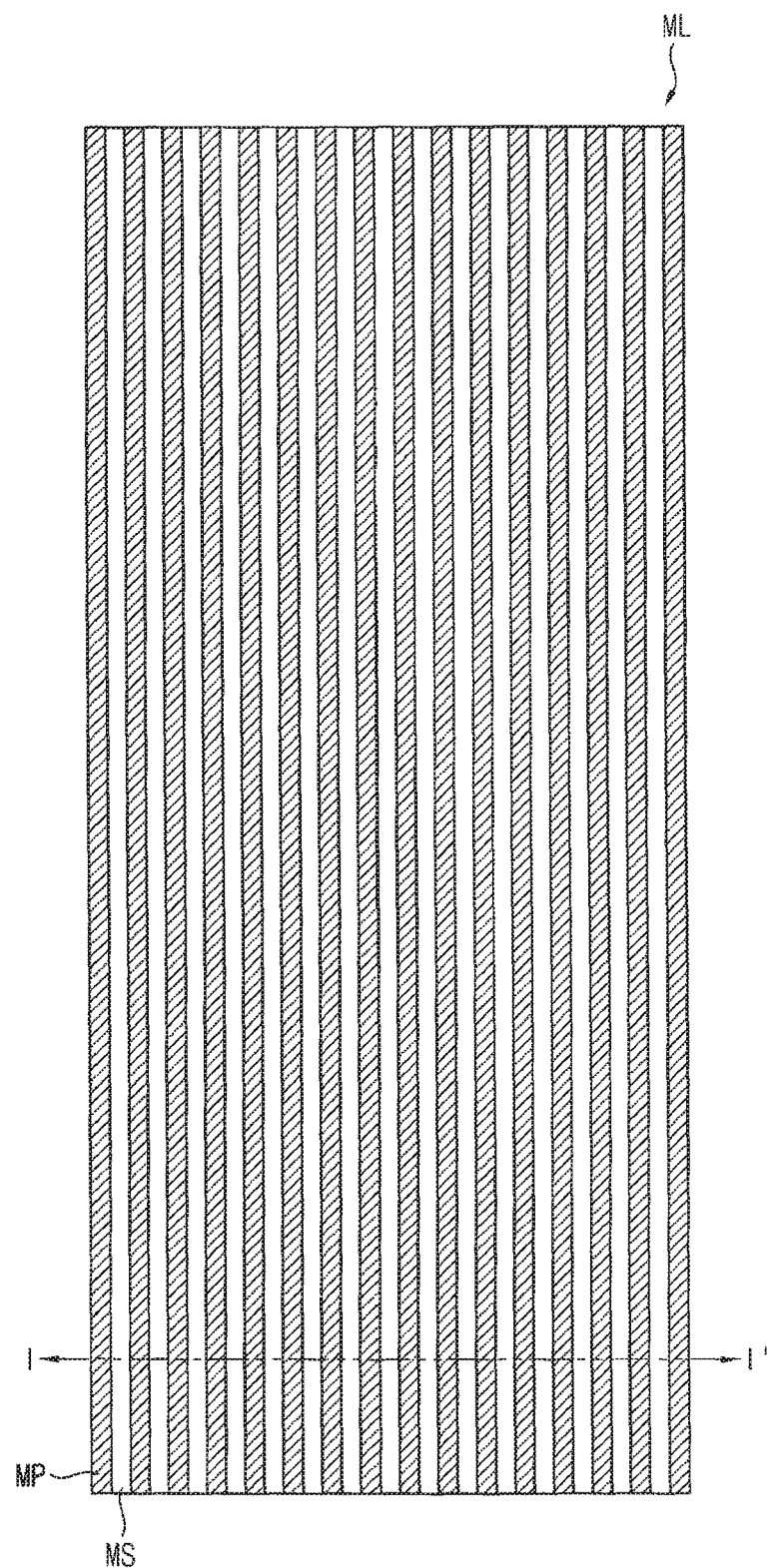
FIG. 3 is an enlarged plan view of metal wirings of FIG. 2, according to one or more exemplary embodiments.
Figure 4:
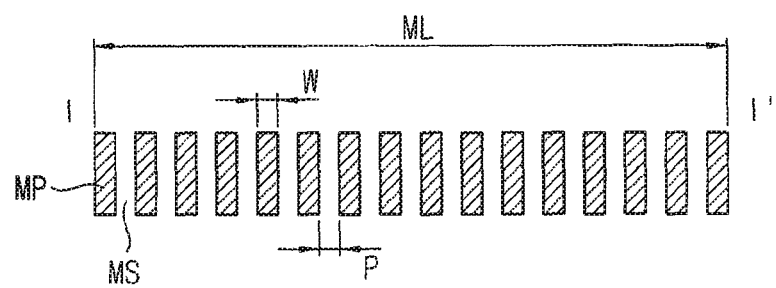
FIG. 4 is a cross-sectional view of the metal wirings of FIG. 3 taken along sectional line I-I', according to one or more exemplary embodiments.

FIG. 3 is an enlarged plan view of metal wirings of FIG. 2, according to one or more exemplary embodiments. FIG. 4 is a cross-sectional view of the metal wirings of FIG. 3 taken along sectional line I-I', according to one or more exemplary embodiments.

Referring to FIGS. 2, 3, and 4, the first touch electrode 331 may include a plurality of first mesh patterns formed by crossings of metal wirings ML including a plurality of fine patterns and the second touch electrode 333 may include a plurality of second mesh patterns formed by crossings of metal wirings ML including a plurality of fine patterns. That is, the first mesh patterns and the second mesh patterns are formed by crossings of metal wirings ML including a plurality of fine patterns.

The metal wirings ML include a plurality of fine patterns. Specifically, each of the metal wirings ML may include the plurality of fine patterns (e.g. a plurality of pattern portions MP) formed of metal material and a plurality of space portions MS located between the pattern portions MP. A pitch P of the pattern portions MP may be less than 150 nm. In addition, a width W of the pattern portion MP may be less than 75 nm. When a pitch P of the pattern portions MP is more than 150 nm and less than 400 nm, a display panel may be seen as a green color or a yellow color. However, when the pitch P of pattern portions MP of a touch screen panel according to one or more exemplary embodiments is less than 150 nm, defects of a display panel may be decreased.

A transmissivity of the metal wirings ML is more than 50%. A sum of widths W of the pattern portions MP may be less than a sum of widths of space portion MS (e.g. a sum of pitches P of pattern portions MP).

Figure 5:
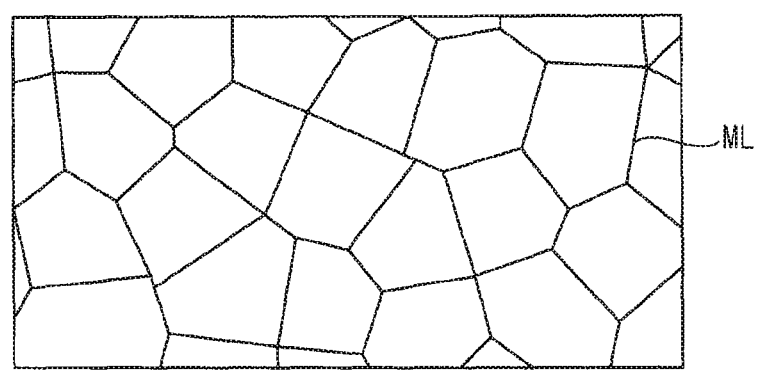
FIG. 5 is an enlarged plan view of portion "B" of FIG. 1, according to one or more exemplary embodiments.
Figure 6:
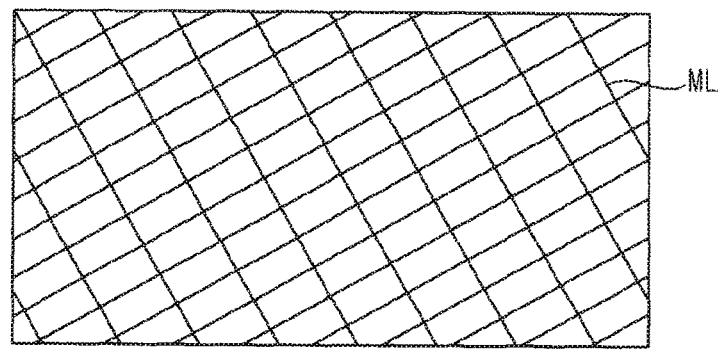
FIG. 6 is an enlarged plan view of portion "B" of FIG. 1, according to one or more exemplary embodiments.
Figure 7:
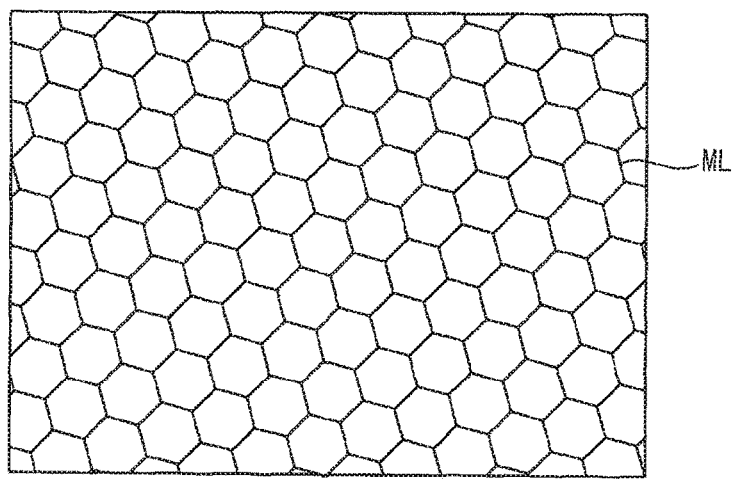
FIG. 7 is an enlarged plan view of portion "B" of FIG. 1, according to one or more exemplary embodiments.

FIG. 5 is an enlarged plan view of portion "B" of FIG. 1, according to one or more exemplary embodiments. FIG. 6 is an enlarged plan view of portion "B" of FIG. 1, according to one or more exemplary embodiments. FIG. 7 is an enlarged plan view of portion "B" of FIG. 1, according to one or more exemplary embodiments.

Referring to FIGS. 5, 6, and 7, various shapes of the first mesh pattern and the second mesh pattern according to one or more exemplary embodiments are illustrated. The mesh pattern in FIG. 5 is an irregular mesh, the manufacturing of the irregular mesh pattern is relatively simple, and related processes are saved. The mesh pattern in FIG. 6 is a rectangular shape, and the mesh pattern in FIG. 7 is a hexagonal shape. That is, the mesh patterns in FIGS. 6 and 7 are uniformly arranged in a regular (or similar) pattern. Since the mesh patterns are uniformly arranged in a regular pattern, the transmittance of the touch screen may be uniform, and, the surface resistance of the mesh-like pattern is distributed uniformly. Furthermore, as the resistance deviation becomes small by the mesh patterns arranged uniformly, the settings for correcting a resistance bias is not necessary to make the image uniform. It is noted that the mesh pattern can be substantially orthogonal straight line lattice patterns, curved wavy line lattice patterns, etc. The mesh cell of the mesh pattern can be a regular shape, such as triangle, diamond, or regular polygon, etc. In addition, it can also be an irregular shape.

FIGS. 9 through 13 are cross-sectional views of a touch screen panel at various stages of manufacture, according to one or more exemplary embodiments. For descriptive convenience, manufacture of the touch screen panel of FIG. 8 will be described in association with FIGS. 9 through 13.

Figure 9:
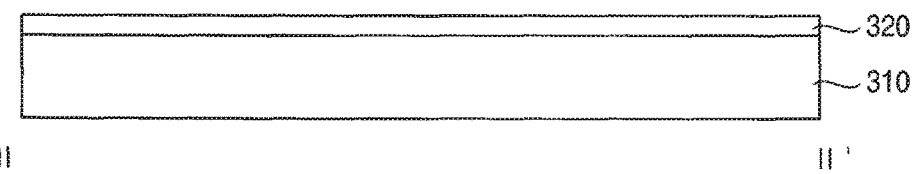
FIGS. 9 through 13 are cross-sectional views of a touch screen panel at various stages of manufacture, according to one or more exemplary embodiments.

Referring to FIG. 9, a first protection layer 320 is formed on the base substrate 310. The base substrate 310 may be a transparent substrate. The base substrate 310 is made of a flexible material, such as made of a material selected from a group consisting of flexible polyethylene terephthalate (PET), polycarbonate (PC), polyethylene (PE), polyvinyl chloride (PVC), polypropylene (PP), polystyrene (PS), and polymethyl methacrylate methyl ester (PMMA). For example, the base substrate 310 may include polycarbonate (PC) and the base substrate 310 may be a circular polarizing film having λ/4 phase difference. The base substrate 310 may be an upper substrate of a display panel of a display device. It is also contemplated that the base substrate 310 may be a separate substrate attached to the display panel.

The first protection layer 320 is disposed on the base substrate 310. The first protection layer 320 may include at least one of a material selected from the group consisting of silicon oxide ($SiO_x$), silicon nitride ($SiN_x$), and aluminum oxide ($AlO_x$). In addition, the first protection layer 320 may include a first layer including an organic material and a second layer overlapping the first layer and including silicon oxide ($SiO_x$).

A refractive index of the first protection layer 320 may be more than 1.7 and less than 1.8. A thickness of the first protection layer 320 may be more than 50 nm and less than 150 nm. A refractive index of the first protection layer 320 may be different from a refractive index of the second protection layer 360. The first protection layer 320 is disposed on the base substrate 310, and, as such, the first protection layer 320 may prevent damage to the base substrate 310. In addition, the first protection layer 320 and the second protection layer 360 may compensate decreases in transmissivity due to refractive index differences between a touch electrode and an insulation layer.

Figure 10:
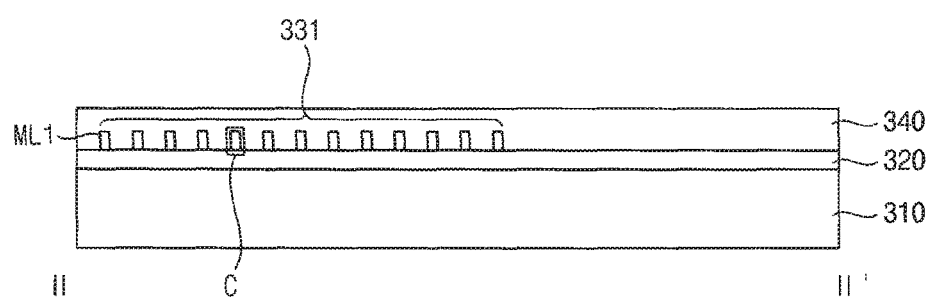

Referring to FIG. 10, a first touch electrode 331 and a first insulation layer 340 are formed on the first protection layer 320. The first touch electrode 331 extends in a first direction D1. The first touch electrode 331 may include a plurality of first mesh patterns formed by crossings of metal wirings ML. The first insulation layer 340 is formed on the first touch electrode 331. The first insulation layer 340 may include an inorganic material, such as silicon oxide ($SiO_x$) and/or silicon nitride ($SiN_x$). For example, the first insulation layer 340 includes silicon oxide (SiOx), and may have a thickness of about 500 Å. In addition, the first insulation layer 340 may include a plurality of layers including different materials from each other or at least one other layer of the first insulation layer 340.

Figure 11:
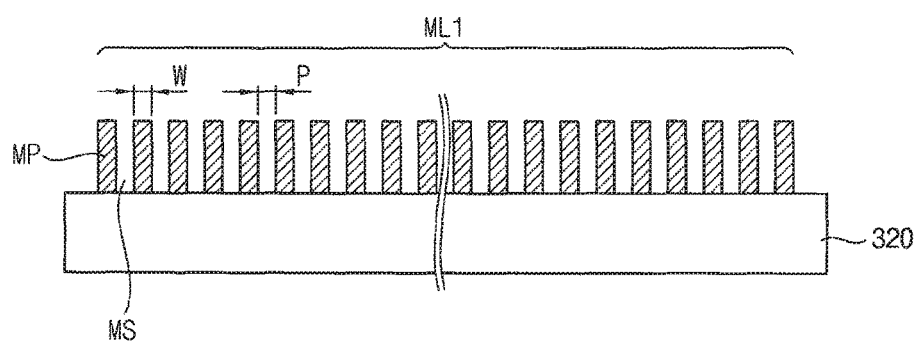

FIG. 11 is an enlarged cross-sectional view of a portion "C" of FIG. 10, according to one or more exemplary embodiments.

Referring to FIG. 11, the first touch electrode 331 includes a plurality of first metal wirings ML1. The first metal wirings ML1 includes a plurality of fine patterns. That is, a plurality of pattern portions MP are formed of metal material. In other words, each of the first metal wiring ML1 may include the plurality of fine patterns formed of metal material (e.g. a plurality of pattern portions MP) and a plurality of space portions MS located between the pattern portions MP. The first touch electrode 331 may be formed by a nanoimprint process; however, the first touch electrode 331 may be formed by various other processes. A pitch P of the pattern portions MP may be less than 150 nm. In addition, a width W of the pattern portions MP may be less than 75 nm. A transmissivity of the first metal wirings ML1 is more than 50%.

Figure 12:
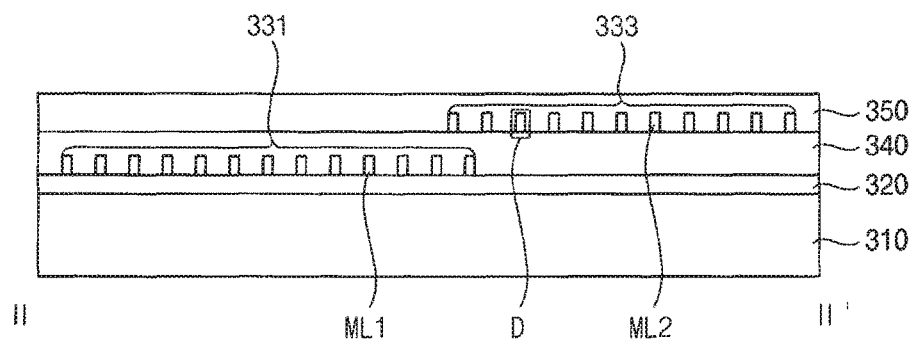

Referring to FIG. 12, a second touch electrode 333 and a second insulation layer 350 are formed on the first insulation layer 340. The second touch electrode 333 extends in a second direction D2 crossing the first direction D1. The second touch electrode 333 may include a plurality of second mesh patterns formed by crossings of metal wirings ML. The second insulation layer 350 is formed on the second touch electrode 333. The second insulation layer 350 may include an inorganic material, such as silicon oxide ($SiO_x$) and/or silicon nitride ($SiN_x$). For example, the second insulation layer 350 includes silicon oxide ($SiO_x$), and may have a thickness of about 500 Å. In addition, the second insulation layer 350 may include a plurality of layers including different materials from each other, or from at least one other layer of the second insulation layer 350.

Figure 13:
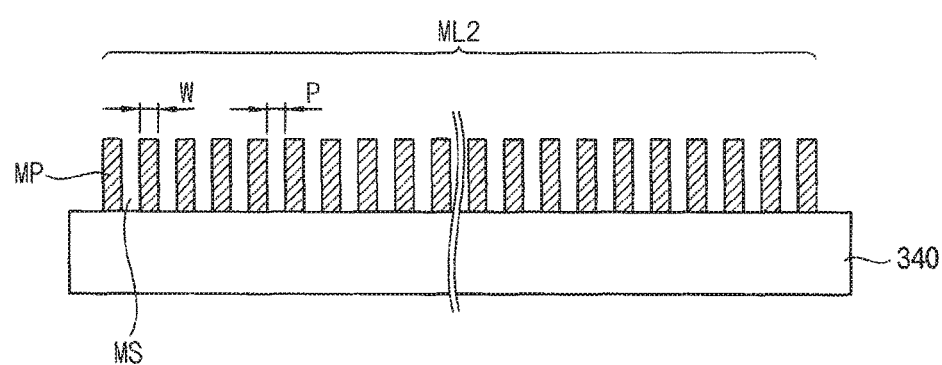

FIG. 13 is an enlarged plan view of a portion "D" of FIG. 12, according to one or more exemplary embodiments.

Referring to FIG. 13, the second touch electrode 333 includes a plurality of second metal wirings ML2. That is, a plurality of pattern portions MP are formed of metal material. In other words, each of the second metal wirings ML2 may include the plurality of fine patterns formed of metal material (e.g. a plurality of pattern portions MP) and a plurality of space portions MS located between the pattern portions MP. The second metal wirings ML2 include the plurality of fine patterns. The second touch electrode 333 may be formed by a nanoimprint process, however, the second touch electrode 333 may be formed by various other processes. A pitch P of the pattern portions MP may be less than 150 nm. In addition, a width W of the pattern portion MP may be less than 75 nm. A transmissivity of the second metal wirings ML2 is more than 50%.

As previous described in association with FIG. 8, a second protection layer 360 may be formed on the second insulation layer 350. The second protection layer 360 may include at least one of a material selected from the group consisting of silicon oxide ($SiO_x$), silicon nitride ($SiN_x$), and aluminum oxide ($AlO_x$). In addition, the second protection layer 360 may include a plurality of layers including different materials from each other, or different than at least one other layer of the second protection layer 360.

A refractive index of the second protection layer 360 may be more than 1.6 and less than 1.75. A thickness of the second protection layer 360 may be more than 50 nm and less than 150 nm. A refractive index of the second protection layer 360 may be different from a refractive index of the first protection layer 320. The second protection layer 360 and the first protection layer 320 may compensate for decreases in transmissivity due to refractive index differences between a touch electrode (e.g., first and second touch electrodes 331 and 333) and an insulation layer (e.g., first and second insulation layers 340 and 350).

Figure 14:
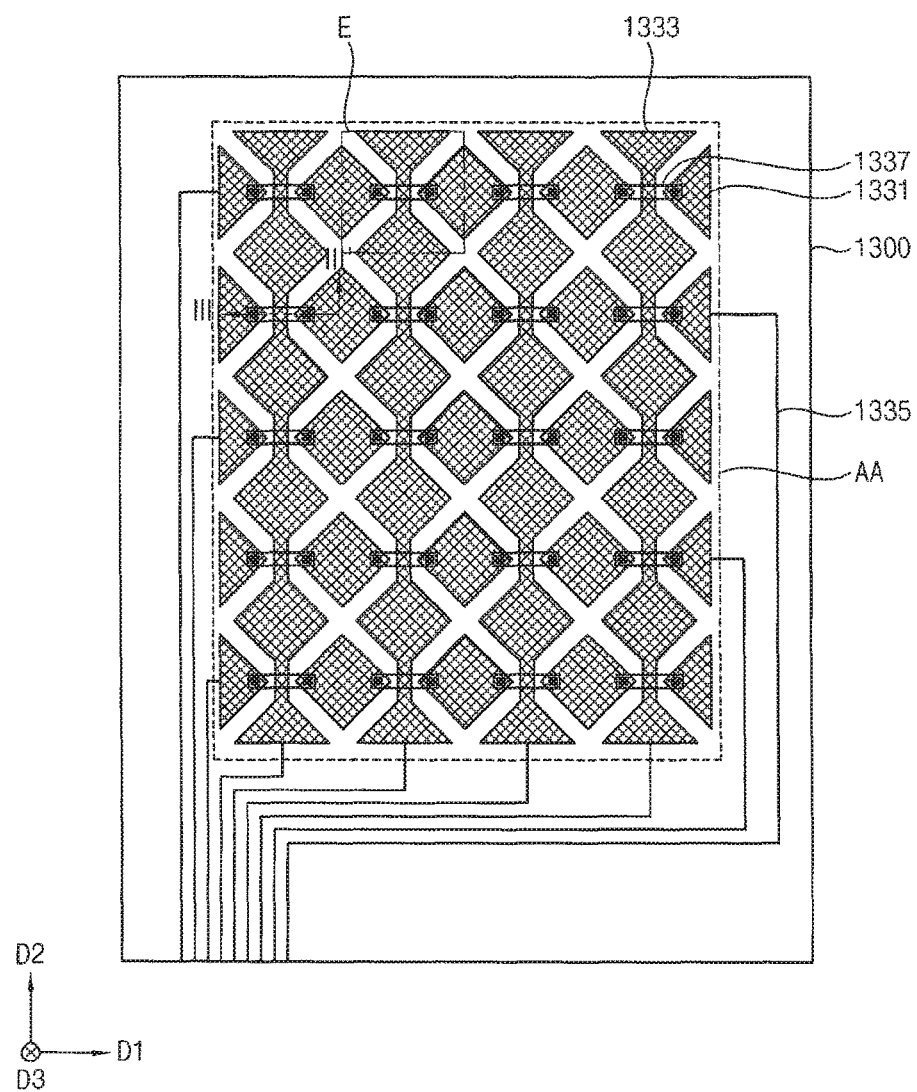
FIG. 14 is a plan view of a touch screen panel, according to one or more exemplary embodiments.
Figure 15:
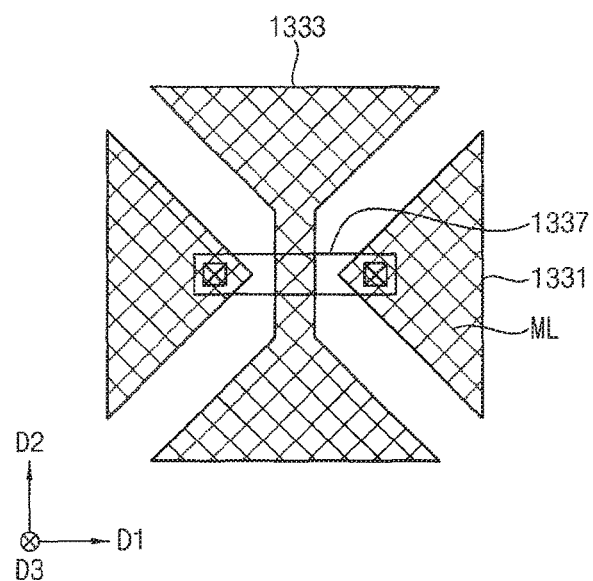
FIG. 15 is an enlarged plan view of portion "E" of FIG. 14, according to one or more exemplary embodiments.
Figure 16:
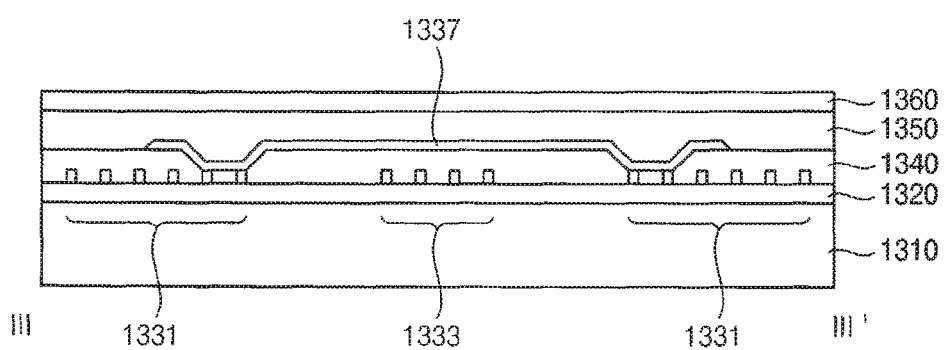
FIG. 16 is a cross-sectional view of the touch screen panel of FIG. 14 taken along sectional line III-III', according to one or more exemplary embodiments.

FIG. 14 is a plan view of a touch screen panel, according to one or more exemplary embodiments. FIG. 15 is an enlarged plan view of portion "E" of FIG. 14, according to one or more exemplary embodiments. FIG. 16 is a cross-sectional view of the touch screen panel of FIG. 14 taken along sectional line III-III', according to one or more exemplary embodiments. The touch screen panel of FIGS. 14, 15, and 16 is similar to the touch screen panel of FIGS. 1 through 13, except for a first touch electrode 1331, a second touch electrode 1333, and a connecting electrode 1337. Thus, to avoid obscuring exemplary embodiments disclosed herein, repetitive explanation will be omitted.

Referring to FIGS. 14, 15, and 16, a touch screen panel 1300 may include a base substrate 1310, a first protection layer 1320, a first insulation layer 1340, a second insulation layer 1350, a second protection layer 1360, a first touch electrode 1331, a second touch electrode 1333, a connecting wiring 1335, and a connecting electrode 1337.

The first touch electrode 1331 and the second touch electrode 1333 are disposed on the first protection layer 1320. The first touch electrode 1331 extends in a first direction D1. The first touch electrode 1331 may include a plurality of first mesh patterns formed by crossings of metal wirings ML. The second touch electrode 1333 extends in a second direction D2 crossing the first direction D1. The second touch electrode 1333 may include a plurality of second mesh patterns formed by crossings of metal wirings ML. The first mesh patterns are separated from each other, and the second mesh patterns are connected with each other.

The first insulation layer 1340 is formed on the first touch electrode 1331 and the second touch electrode 1333. The first insulation layer 1340 may include an inorganic material, such as silicon oxide ($SiO_x$) and/or silicon nitride ($SiN_x$). For example, the first insulation layer 1340 includes silicon oxide ($SiO_x$), and may have a thickness of about 500 Å. In addition, the first insulation layer 1340 may include a plurality of layers including different materials from each other, or at least one other layer of the first insulation layer 1340.

The connecting electrode 1337 is disposed on the first insulation layer 1340. The connecting electrode 1337 may electrically connect the first mesh patterns. The connecting electrode 1337 may include a transparent conductive material, such as aluminum zinc oxide (AZO), indium tin oxide (ITO), gallium zinc oxide (GZO), indium zinc oxide (IZO), and the like; however, exemplary embodiments are not limited thereto. The connecting electrode 1337 may be formed of a mesh pattern having the same shape as the first mesh patterns. In addition, the connecting electrode 1337 may include a relatively low-resistance metallic material, such as copper (Cu), aluminum (Al), molybdenum (Mo), titanium (Ti), silver (Ag), gold (Au), nickel (Ni), chromium (Cr), iron (Fe), indium (In), and gallium (Ga).

The second insulation layer 1350 is formed on the connecting electrode 1337. The second insulation layer 1350 may include an inorganic material, such as silicon oxide ($SiO_x$) and/or silicon nitride ($SiN_x$). For example, the second insulation layer 1350 includes silicon oxide ($SiO_x$), and may have a thickness of about 500 Å. In addition, the second insulation layer 1350 may include a plurality of layers including different materials from each other, or at least one other layer of the second insulation layer 1350.

The second protection layer 1360 is disposed on the second insulation layer 1350. The second protection layer 1360 may include at least one of a material selected from the group consisting of silicon oxide ($SiO_x$), silicon nitride ($SiN_x$), and aluminum oxide ($AlO_x$). In addition, the second protection layer 1360 may include a plurality of layers including different materials from each other, or at least one other layer of the second protection layer.

FIGS. 17 through 20 are cross-sectional views of a touch screen panel at various stages of manufacture, according to one or more exemplary embodiments. For descriptive convenience, manufacture of the touch screen panel of FIG. 16 will be described in association with FIGS. 17 through 20.

Figure 17:
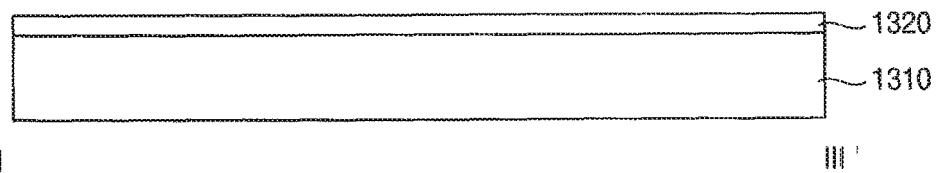
FIGS. 17 through 20 are cross-sectional views of a touch screen panel at various stages of manufacture, according to one or more exemplary embodiments.

Referring to FIG. 17, a first protection layer 1320 is formed on the base substrate 1310. The base substrate 1310 may be a transparent substrate. The base substrate 1310 is made of a flexible material, such as made of a material selected from a group consisting of flexible polyethylene terephthalate (PET), polycarbonate (PC), polyethylene (PE), polyvinyl chloride (PVC), polypropylene (PP), polystyrene (PS), and polymethyl methacrylate methyl ester (PMMA). For example, the base substrate 1310 may include polycarbonate (PC) and the base substrate 1310 may be a circular polarizing film having λ/4 phase difference. The base substrate 1310 may be an upper substrate of a display panel of a display device. It is also contemplated that the base substrate 1310 may be a separate substrate attached to the display panel.

The first protection layer 1320 is disposed on the base substrate 1310. The first protection layer 1320 may include at least one of a material selected from the group consisting of silicon oxide ($SiO_x$), silicon nitride ($SiN_x$), and aluminum oxide ($AlO_x$). In addition, the first protection layer 1320 may include a first layer including an organic material and a second layer overlapping the first layer and including silicon oxide ($SiO_x$).

A refractive index of the first protection layer 1320 may be more than 1.7 and less than 1.8. A thickness of the first protection layer 1320 may be more than 50 nm and less than 150 nm. A refractive index of the first protection layer 1320 may be different from a refractive index of the second protection layer 1360. The first protection layer 1320 is disposed on the base substrate 1310, and, as such, the first protection layer 1320 prevents damage to the base substrate 1310. In addition, the first protection layer 1320 and the second protection layer 1360 may compensate for decreases in transmissivity due to refractive index differences between a touch electrode (e.g., first and second touch electrodes 1331 and 1333) and an insulation layer (e.g., first and second insulation layers 1340 and 1350).

Figure 18:
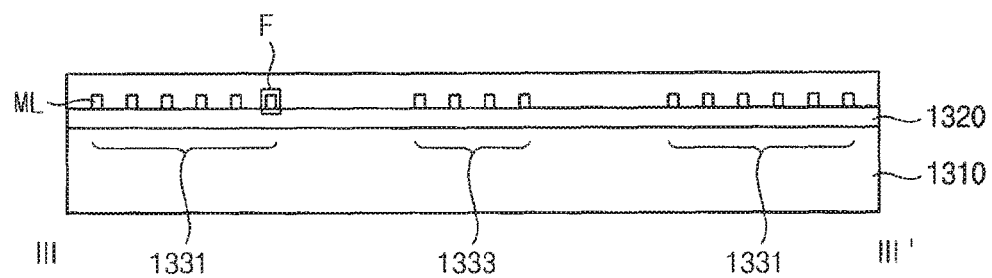

Referring to FIG. 18, a first touch electrode 1331, a second touch electrode 1333 and a first insulation layer 1340 are formed on the first protection layer 1320. That is, the first touch electrode 1331 is disposed on the same layer as the second touch electrode 1333. As shown in FIG. 14, the first touch electrode 1331 extends in a first direction D1. The first touch electrode 1331 may include a plurality of first mesh patterns formed by crossings of metal wirings. The second touch electrode 1333 extends in a second direction D2 crossing the first direction D1. The second touch electrode 1333 may include a plurality of second mesh patterns formed by crossings of metal wirings.

The first insulation layer 1340 is formed on the first touch electrode 1331 and the second touch electrode 1333. The first insulation layer 1340 may include an inorganic material, such as silicon oxide ($SiO_x$) and/or silicon nitride ($SiN_x$). For example, the first insulation layer 1340 includes silicon oxide ($SiO_x$), and may have a thickness of about 500 Å. In addition, the first insulation layer 1340 may include a plurality of layers including different materials from each other, or at least one other layer of the first insulation layer 1340.

Figure 19:
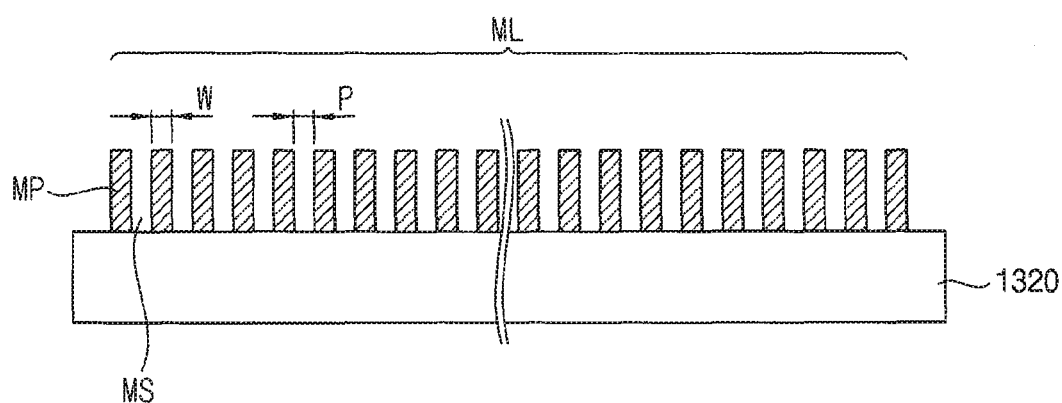

FIG. 19 is an enlarged plan view of portion "F" of FIG. 18, according to one or more exemplary embodiments.

Referring to FIG. 19, the first touch electrode 1331 and the second touch electrode 1333 include a plurality of metal wirings ML. The metal wirings ML includes plurality of fine patterns; that is, a plurality of pattern portions MP are formed of metal material. In other words, each of the metal wiring ML may include the plurality of fine patterns formed of metal material (e.g. a plurality of pattern portions MP) and a plurality of space portions MS located between the pattern portions MP. The first touch electrode 1331 and the second touch electrode 1333 may be formed by a nanoimprint process; however, the first touch electrode 1331 and the second touch electrode 1333 may be formed by various other processes. A pitch P of the pattern portions MP may be less than 150 nm. In addition, a width W of the pattern portion MP may be less than 75 nm. A transmissivity of the metal wirings ML is more than 50%.

Figure 20:
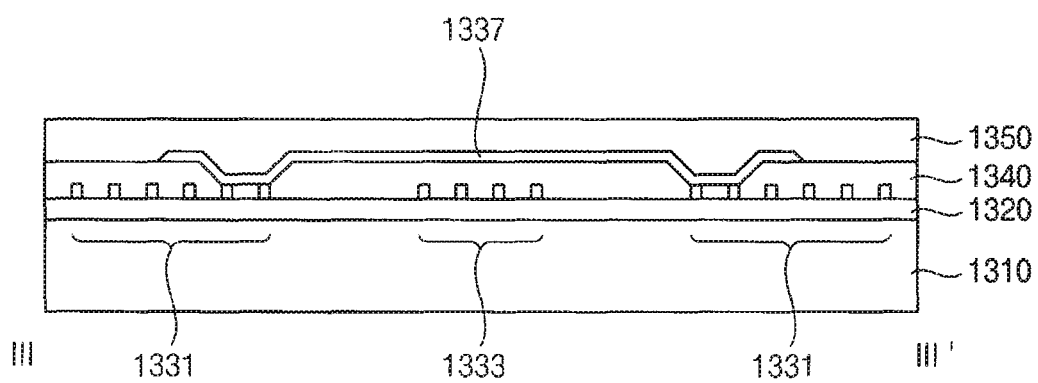

Referring to FIG. 20, a connecting electrode 1337 and a second insulation layer 1350 are formed on the first insulation layer 1340. The connecting electrode 1337 is disposed on the first insulation layer 1340. The connecting electrode 1337 may electrically connect the first mesh patterns. The connecting electrode 1337 may include a transparent conductive material, such as aluminum zinc oxide (AZO), indium tin oxide (ITO), gallium zinc oxide (GZO), indium zinc oxide (IZO), and the like; however, exemplary embodiments are not limited thereto. The connecting electrode 1337 may be formed of a mesh pattern having the same shape as the first mesh patterns. In addition, the connecting electrode 1337 may include a relatively low-resistance metallic material, such as copper (Cu), aluminum (Al), molybdenum (Mo), titanium (Ti), silver (Ag), gold (Au), nickel (Ni), chromium (Cr), iron (Fe), indium (In), and gallium (Ga).

The second insulation layer 1350 is formed on the connecting electrode 1337. The second insulation layer 1350 may include an inorganic material, such as silicon oxide ($SiO_x$) and/or silicon nitride ($SiN_x$). For example, the second insulation layer 1350 includes silicon oxide ($SiO_x$), and may have a thickness of about 500 Å. In addition, the second insulation layer 1350 may include a plurality of layers including different materials from each other, or at least one other layer of the second insulation layer 1350.

As previous described in association with FIG. 16, a second protection layer 1360 is formed on the second insulation layer 1350. The second protection layer 1360 may include at least one of a material selected from the group consisting of silicon oxide ($SiO_x$), silicon nitride ($SiN_x$), and aluminum oxide ($AlO_x$). In addition, the second protection layer 1360 may include a plurality of layers including different materials from each other, or at least one other layer of the second protection layer 1360. A refractive index of the second protection layer 1360 may be more than 1.6 and less than 1.75. A thickness of the second protection layer 1360 may be more than 50 nm and less than 150 nm. A refractive index of the second protection layer 1360 may be different from a refractive index of the first protection layer 1320. The second protection layer 1360 and the first protection layer 1320 may compensate for decreases in transmissivity due to refractive index difference between a touch electrode (e.g., first and second touch electrodes 1331 and 1333) and an insulation layer (e.g., first and second insulation layers 1340 and 1350).

Figure 21:
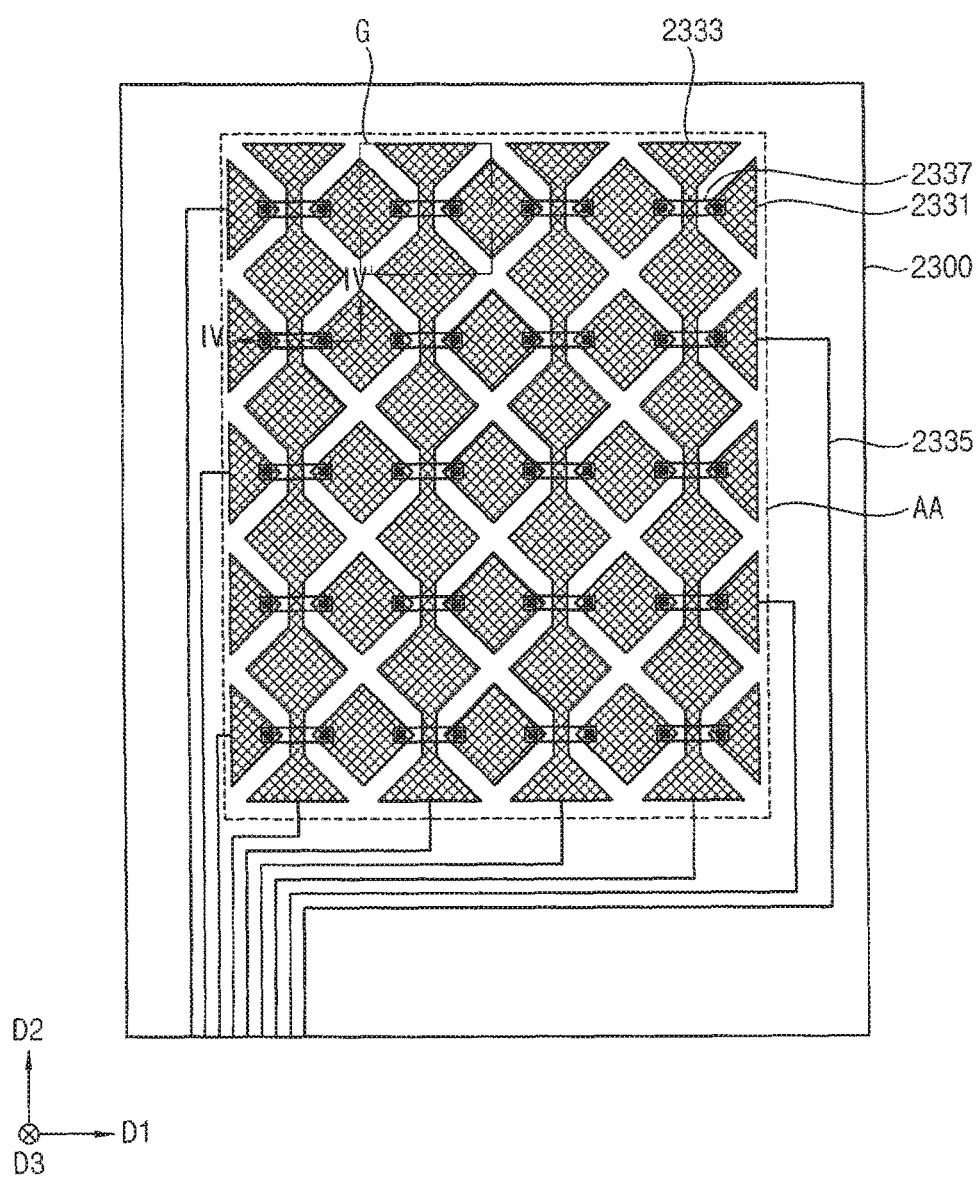
FIG. 21 is a plan view of a touch screen panel, according to one or more exemplary embodiments.
Figure 22:
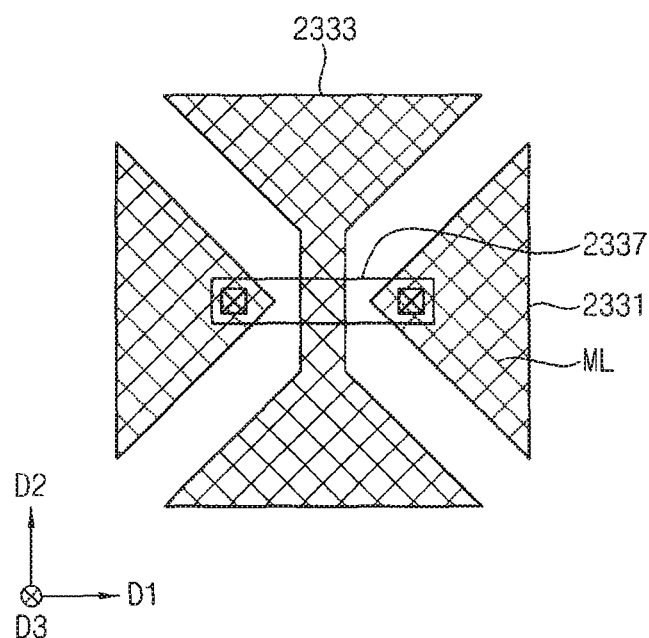
FIG. 22 is an enlarged plan view of portion "G" of FIG. 21, according to one or more exemplary embodiments.
Figure 23:
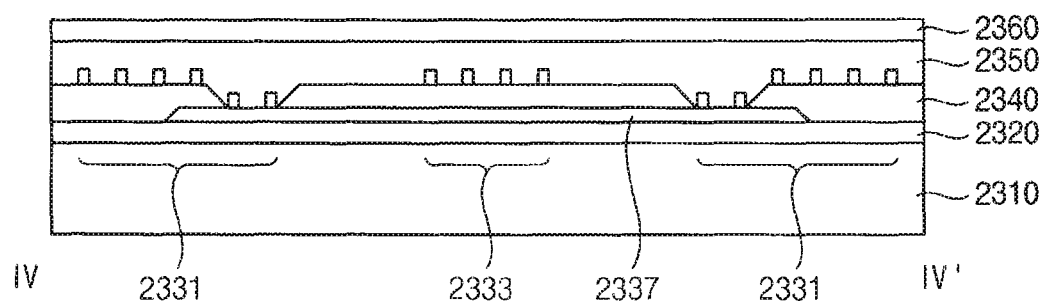
FIG. 23 is a cross-sectional view of the touch screen panel of FIG. 21 taken along sectional line Iv-IV', according to one or more exemplary embodiments.

FIG. 21 is a plan view of a touch screen panel, according to one or more exemplary embodiments. FIG. 22 is an enlarged plan view of portion "G" of FIG. 21, according to one or more exemplary embodiments. FIG. 23 is a cross-sectional view of the touch screen panel of FIG. 21 taken along sectional line IV-IV', according to one or more exemplary embodiments. The touch screen panel of FIGS. 21, 22, and 23 is similar to the touch screen panel of FIGS. 1 through 13, except for a first touch electrode 2331, a second touch electrode 2333, and a connecting electrode 2337. Thus, to avoid obscuring exemplary embodiments disclosed herein, repetitive explanation will be omitted.

Referring to FIGS. 21, 22, and 23, a touch screen panel 2300 may include a base substrate 2310, a first protection layer 2320, a first insulation layer 2340, a second insulation layer 2350, a second protection layer 2360, a first touch electrode 2331, a second touch electrode 2333, a connecting wiring 2335, and a connecting electrode 2337.

The connecting electrode 2337 is disposed on the first protection layer 2320. The connecting electrode 2337 may electrically connect the first mesh patterns. The connecting electrode 2337 may include a transparent conductive material, such as aluminum zinc oxide (AZO), indium tin oxide (ITO), gallium zinc oxide (GZO), indium zinc oxide (IZO), and the like; however, exemplary embodiments are not limited thereto. The connecting electrode 2337 may be formed of a mesh pattern having the same shape as the first mesh patterns. In addition, the connecting electrode 2337 may include a relatively low-resistance metallic material, such as copper (Cu), aluminum (Al), molybdenum (Mo), titanium (Ti), silver (Ag), gold (Au), nickel (Ni), chromium (Cr), iron (Fe), indium (In), and gallium (Ga).

The first insulation layer 2340 is formed on the connecting electrode 2337. The first insulation layer 2340 may include an inorganic material, such as silicon oxide ($SiO_x$) and/or silicon nitride ($SiN_x$). For example, the first insulation layer 2340 includes silicon oxide ($SiO_x$), and may have a thickness of about 500 Å. In addition, the first insulation layer 2340 may include a plurality of layers including different materials from each other, or at least one other layer of the first insulation layer 2340.

The first touch electrode 2331 and the second touch electrode 2333 are disposed on the first insulation layer 2340. The first touch electrode 2331 extends in a first direction D1. The first touch electrode 2331 may include a plurality of first mesh patterns formed by crossings of metal wirings ML. The second touch electrode 2333 extends in a second direction D2 crossing the first direction D1. The second touch electrode 2333 may include a plurality of second mesh patterns formed by crossings of metal wirings ML. The first mesh patterns are separated from each other, and the second mesh patterns are connected with each other.

The second insulation layer 2350 is formed on the first touch electrode 2331 and the second touch electrode 2333. The second insulation layer 2350 may include an inorganic material, such as silicon oxide ($SiO_x$) and/or silicon nitride ($SiN_x$). For example, the second insulation layer 2350 includes silicon oxide ($SiO_x$), and may have a thickness of about 500 Å. In addition, the second insulation layer 2350 may include a plurality of layers including different materials from each other, or at least one other layer of the second insulation layer 2350.

The second protection layer 2360 is disposed on the second insulation layer 2350. The second protection layer 2360 may include at least one of a material selected from the group consisting of silicon oxide ($SiO_x$), silicon nitride ($SiN_x$), and aluminum oxide ($AlO_x$). In addition, the second protection layer 2360 may include a plurality of layers including different materials from each other, or at least one other layer of the second protection layer 2360.

FIGS. 24 through 27 are cross-sectional views of a touch screen panel at various stages of manufacture, according to one or more exemplary embodiments. For descriptive convenience, manufacture of the touch screen panel of FIG. 23 will be described in association with FIGS. 24 through 27.

Figure 24:
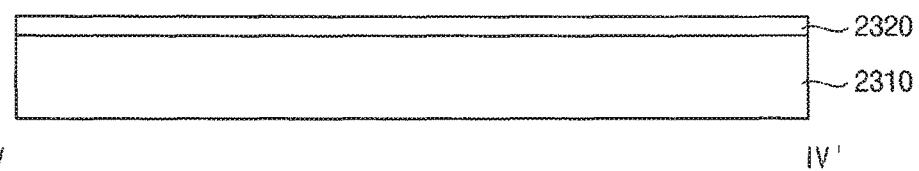
FIGS. 24 through 27 are cross-sectional views of a touch screen panel at various stages of manufacture, according to one or more exemplary embodiments.

Referring to FIG. 24, a first protection layer 2320 is formed on the base substrate 2310. The base substrate 2310 may be a transparent substrate. The base substrate 2310 is made of a flexible material, such as made of a material selected from a group consisting of flexible polyethylene terephthalate (PET), polycarbonate (PC), polyethylene (PE), polyvinyl chloride (PVC), polypropylene (PP), polystyrene (PS), and polymethyl methacrylate methyl ester (PMMA). For example, the base substrate 2310 may include polycarbonate (PC) and the base substrate 2310 may a circular polarizing film having λ/4 phase difference. The base substrate 2310 may be an upper substrate of a display panel of a display device. It is also contemplated that the base substrate 2310 may be a separate substrate attached to the display panel.

The first protection layer 2320 is disposed on the base substrate 2310. The first protection layer 2320 may include at least one of a material selected from the group consisting of silicon oxide ($SiO_x$), silicon nitride ($SiN_x$), and aluminum oxide ($AlO_x$). In addition, the first protection layer 2320 may include a first layer including an organic material and a second layer overlapping the first layer and including silicon oxide ($SiO_x$). A refractive index of the first protection layer 2320 may be more than 1.7 and less than 1.8. A thickness of the first protection layer 2320 may be more than 50 nm and less than 150 nm. A refractive index of the first protection layer 2320 may be different from a refractive index of the second protection layer 2360. The first protection layer 2320 is disposed on the base substrate 2310, and, as such, the first protection layer 2320 prevents damage to the base substrate 2310. In addition, the first protection layer 2320 and the second protection layer 2360 may compensate for decreases in transmissivity due to refractive index difference between a touch electrode (e.g., first and second touch electrodes 2331 and 2333) and an insulation layer (e.g., first and second insulation layers 2340 and 2350).

Figure 25:
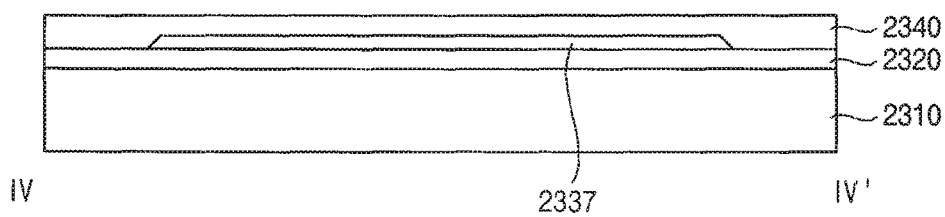

Referring to FIG. 25, a connecting electrode 2337 and a first insulation layer 2340 are formed on the first protection layer 2320. The connecting electrode 2337 is disposed on the first protection layer 2320. The connecting electrode 2337 may electrically connect the first mesh patterns. The connecting electrode 2337 may include a transparent conductive material, such as aluminum zinc oxide (AZO), indium tin oxide (ITO), gallium zinc oxide (GZO), indium zinc oxide (IZO), and the like; however, exemplary embodiments are not limited thereto. The connecting electrode 2337 may be formed of a mesh pattern having the same shape as the first mesh patterns. In addition, the connecting electrode 2337 may include a relatively low-resistance metallic material, such as copper (Cu), aluminum (Al), molybdenum (Mo), titanium (Ti), silver (Ag), gold (Au), nickel (Ni), chromium (Cr), iron (Fe), indium (In), and gallium (Ga).

The first insulation layer 2340 is formed on the connecting electrode 2337. The first insulation layer 2340 may include an inorganic material, such as silicon oxide ($SiO_x$) and/or silicon nitride ($SiN_x$). For example, the first insulation layer 2340 includes silicon oxide ($SiO_x$), and may have a thickness of about 500 Å. In addition, the first insulation layer 2340 may include a plurality of layers including different materials from each other, or at least one other layer of the first insulation layer 2340.

Figure 26:
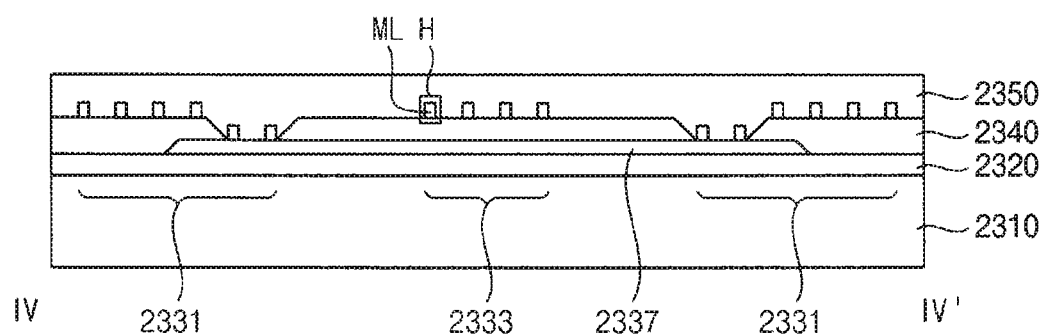

Referring to FIG. 26, a first touch electrode 2331, a second touch electrode 2333, and a second insulation layer 2350 are formed on the first insulation layer 2340. The first touch electrode 2331 and the second touch electrode 2333 are disposed on the first insulation layer 2340. As shown in FIG. 21, the first touch electrode 2331 extends in a first direction D1. The first touch electrode 2331 may include a plurality of first mesh patterns formed by crossings of metal wirings ML. The second touch electrode 2333 extends in a second direction D2 crossing the first direction D1. The second touch electrode 2333 may include a plurality of second mesh patterns formed by crossings of metal wirings ML. The first mesh patterns are separated from each other, and the second mesh patterns are connected with each other.

The second insulation layer 2350 is formed on the first touch electrode 2331 and the second touch electrode 2333. The second insulation layer 2350 may include an inorganic material, such as silicon oxide ($SiO_x$) and/or silicon nitride ($SiN_x$). For example, the second insulation layer 2350 includes silicon oxide ($SiO_x$), and may have a thickness of about 500 Å. In addition, the second insulation layer 2350 may include a plurality of layers including different materials from each other, or at least one other layer of the second insulation layer 2350.

Figure 27:
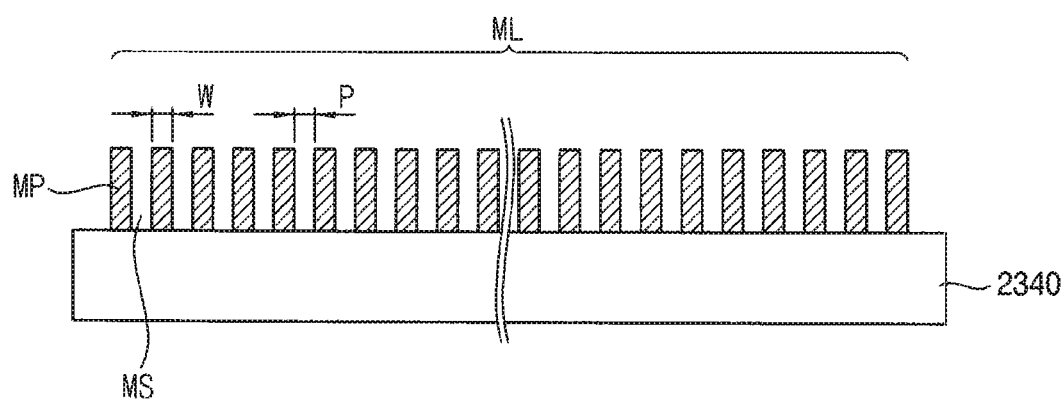

FIG. 27 is an enlarged plan view of portion "H" of FIG. 26, according to one or more exemplary embodiments.

Referring to FIG. 27, the first touch electrode 2331 and the second touch electrode 2333 include a plurality of metal wirings ML. The metal wirings ML includes a plurality of fine patterns; that is, the plurality of pattern portions MP are formed of metal material. In other words, each of the metal wiring ML may include the plurality of fine patterns formed of metal material (e.g. a plurality of pattern portions MP) and a plurality of space portions MS located between the pattern portions MP. The first touch electrode 2331 and the second touch electrode 2333 may be formed by a nanoimprint process; however, the first touch electrode 2331 and the second touch electrode 2333 may be formed by various other processes. A pitch P of the pattern portions MP may be less than 150 nm. In addition, a width W of the pattern portion MP may be less than 75 nm. A transmissivity of the metal wirings ML is more than 50%.

As previous described in association with FIG. 23, a second protection layer 2360 may be formed on the second insulation layer 2350. The second protection layer 2360 may include at least one of a material selected from the group consisting of silicon oxide ($SiO_x$), silicon nitride ($SiN_x$), and aluminum oxide ($AlO_x$). In addition, the second protection layer 2360 may include a plurality of layers including different materials from each other.

Figure 28:
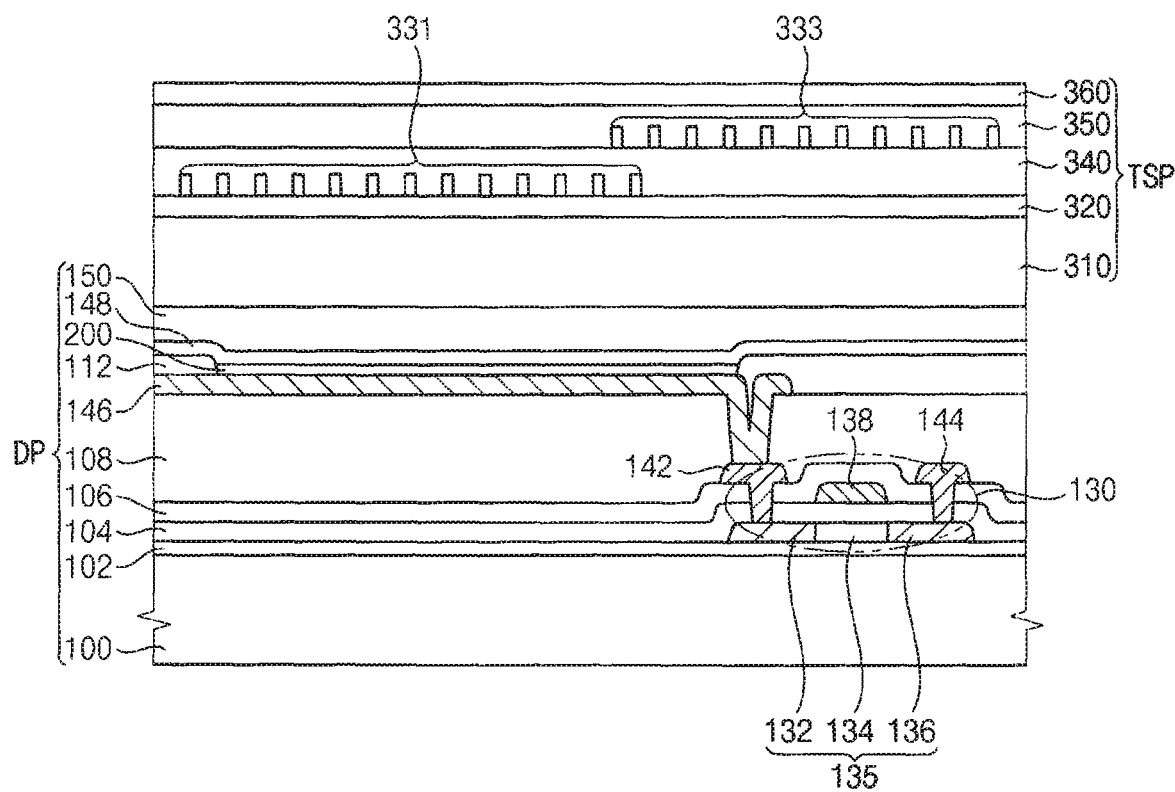
FIG. 28 is a cross-sectional view of a touch display device, according to one or more exemplary embodiments.

FIG. 28 is a cross-sectional view of a touch display device, according to one or more exemplary embodiments.

Referring to FIG. 28, a touch display device may include a display panel DP configured to display an image and a touch screen panel TSP disposed on the display panel DP. The touch display device may be an organic light emitting diode touch display device, however, exemplary embodiments are not limited thereto.

The display panel DP includes a lower substrate 100, a buffer layer 102, a gate insulating layer 104, an insulating interlayer 106, a planarizing layer 108, a pixel defining layer 112, a thin film transistor (TFT) 130, a first electrode 146, a second electrode 148, an organic light emitting element 200, and an encapsulation substrate 150.

The lower substrate 100 may include a transparent insulating substrate. For example, the lower substrate 100 may include a glass substrate, a quartz substrate, a transparent resin substrate including a transparent resin, etc. Examples of a transparent resin that may be used for the lower substrate 100 may include a polyimide resin, an acrylic resin, a polyacrylate resin, a polycarbonate resin, a polyether resin, a polyethylene terephthalate resin, a sulfonic acid based resin, etc.

The buffer layer 102 is disposed on the lower substrate 100, and includes an insulating material. Examples of the insulating material that may be used for the buffer layer 102 may include an inorganic insulating material, such as silicon oxide ($SiO_x$), silicon nitride ($SiN_x$), silicon oxynitride ($SiO_xN_y$), silicon carbon-oxide ($SiO_xC_y$), silicon carton-nitride ($SiC_xN_y$), etc. The inorganic insulating material may be used alone, a combination thereof, a mixture thereof, or a stacked structure thereof. When the buffer layer 102 includes the stacked structure, the buffer layer 102 may have a multilayered structure including a silicon oxide layer, a silicon nitride layer, a silicon oxynitride layer, a silicon carton-oxide layer, and/or a silicon carbon-nitride layer. The buffer layer 102 prevents diffusion of metal atoms or impurities from the lower substrate 100 to control speed of heat transfer during a subsequent crystallization process for an active pattern 135. Thus, electric characteristics of the active pattern 135 may be improved. Also, the buffer layer 102 planarizes a surface of the lower substrate 100.

The active pattern 135 is disposed on the buffer layer 102. For example, the active pattern 135 may include polysilicon. The active pattern 135 includes a drain contact portion 132, a source contact portion 136, and a channel portion 134. The drain contact portion 132 makes contact with a drain electrode 142 of a thin film transistor 130. The source contact portion 136 makes contact with a source electrode 144 of the thin film transistor 130. The channel portion 134 is disposed between the drain contact portion 132 and the source contact portion 136.

The gate insulating layer 104 is disposed on the buffer layer 102 on which the active pattern 135 is formed to electrically insulate the active pattern 135 from the gate electrode 138 and a gate line (not shown). The gate insulating layer 104 may include silicon nitride, metal oxide, etc. Examples of an insulating material that may be used for the gate insulating layer 104 may include hafnium oxide ($HfO_x$), aluminum oxide ($AlO_x$), zirconium oxide ($ZrO_x$), titanium oxide ($TiO_x$), tantalum oxide ($TaO_x$), etc. These may be used alone, a combination thereof, a mixture thereof, or a stacked structure thereof. The gate insulating layer 104 may include a plurality of contact holes through which the source contact portion 136 and the drain contact portion 132 are exposed.

The gate electrode 138 is disposed on the gate insulating layer 104. The gate electrode 138 is disposed on the channel portion 134 of the active pattern 135. When a voltage difference is formed between the gate electrode 138 and the source electrode 144, the thin film transistor 130 is turned on so that a current flows through the channel portion 134 toward the drain electrode 142.

The gate electrode 138 may include a conductive material, such as metal, alloy, metal nitride, conductive metal oxide, transparent conductive material, etc. Examples of the conductive material that may be used for the gate electrode 138 may include aluminum, aluminum alloy, aluminum nitride ($AlN_x$), silver (Ag), silver alloy, tungsten (W), tungsten nitride ($WN_x$), copper, copper alloy, nickel (Ni), chromium (Cr), chromium nitride ($CrN_x$), molybdenum (Mo), molybdenum alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), indium tin oxide (ITO), tin oxide ($SnO_x$), indium oxide ($InO_x$), gallium oxide ($GaO_x$), indium zinc oxide (IZO), etc. These can be used alone or in a combination thereof. Also, the gate electrode 138 may have a mono-layered structure or a multi-layered structure including a metal layer, an alloy layer, a metal nitride layer, a conductive metal oxide layer, and/or a transparent conductive material layer.

The insulating interlayer 106 is formed on the gate insulating layer 104 on which the gate electrode 138 and the gate line (not shown) are formed. The insulating interlayer 106 insulates the gate electrode 138 and the gate line (not shown) from the source electrode 144 and the drain electrode 142. The insulating interlayer 106 may include silicon compound. Examples of an insulating material that may be used for the insulating interlayer 106 may include silicon oxide, silicon nitride, silicon oxynitride, silicon carbon-nitride, silicon carbon-oxide, etc. These may be used alone or in a combination thereof. The insulating interlayer 106 has a plurality of contact holes through which the source contact portion 136 and the drain contact portion 132 of the active pattern 135 are exposed.

The source electrode 144 and the drain electrode 142 are formed on the insulating interlayer 106. The source electrode 144 and the drain electrode 142 make contact with the source contact portion 136 and the drain contact portion 132 of the active pattern 135, respectively. The source and drain electrodes 142 and 144 may include a conductive material, such as metal, alloy, metal nitride, conductive metal oxide, transparent conductive material, etc. Examples of the conductive material that may be used for the source and drain electrodes 144 and 142 may include aluminum, aluminum alloy, aluminum nitride ($AlN_x$), silver (Ag), silver alloy, tungsten (W), tungsten nitride ($WN_x$), copper, copper alloy, nickel (Ni), chromium (Cr), chromium nitride ($CrN_x$), molybdenum (Mo), molybdenum alloy, titanium (Ti), titanium nitride ($TiN_x$), platinum (Pt), tantalum (Ta), tantalum nitride ($TaN_x$), neodymium (Nd), scandium (Sc), strontium ruthenium oxide (SRO), zinc oxide ($ZnO_x$), indium tin oxide (ITO), tin oxide ($SnO_x$), indium oxide ($InO_x$), gallium oxide ($GaO_x$), indium zinc oxide (IZO), etc. These can be used alone or in a combination thereof. Also, the source and drain electrodes 142 and 144 may have a mono-layered structure or a multi-layered structure including a metal layer, an alloy layer, a metal nitride layer, a conductive metal oxide layer, and/or a transparent conductive material layer.

The planarizing layer 108 is formed on the insulating interlayer 106 on which the source and drain electrodes 142 and 144 and the date line (not shown) are formed to electrically insulate the source electrode 144 from the first electrode 146. The planarizing layer 108 may include organic insulating material or inorganic insulating material. Examples of the insulating material that may be used for the planarizing layer 108 may include a photoresist, an acrylic resin, a polyimide resin, a polyamide resin, a siloxane resin, a photoresist acryl carboxyl resin, a novolak resin, an alkaline soluble resin, silicon compound, silicon nitride, silicon oxynitride, silicon carbon-oxide, silicon carbon-nitride, etc. These may be used alone or in a combination thereof. The planarizing layer 108 has a contact hole through which the drain electrode 142 is exposed.

The first electrode 146 is disposed on the planarizing layer 108 corresponding to the pixel region, and is electrically connected to the drain electrode 142 through the contact hole of the planarizing layer 108.

When the display panel DP is a front illumination type, the first electrode 146 may include a reflective metal, a reflective alloy, etc. For example, the first electrode 146 may include silver, platinum, gold, chromium, tungsten, molybdenum, titanium, palladium, iridium, an alloy thereof, etc. These may be alone or in a combination thereof. Alternatively, the first electrode 146 may include a transparent conductive material, such as indium tin oxide, tin oxide, indium zinc oxide, zinc oxide, indium gallium oxide, gallium oxide, etc. These may be used alone or in a combination thereof.

The pixel defining layer 112 is disposed on the planarizing layer 108 on which the first electrode 146 is formed, to expose a portion of the first electrode 146. The pixel defining layer 112 may include organic material or inorganic material. Examples of the material that may be used for the pixel defining layer 112 may include photoresist, a poly acrylic resin, a polyimide resin, an acrylic resin, a silicon compound, etc. A display region and a non-display region are defined on the OLED by the exposed portion of the first electrode 146 that is exposed by the pixel defining layer 112. For example, the exposed portion of the first electrode 146, which is exposed by the pixel defining layer 112 corresponds to the display region. A remaining portion of the pixel defining layer 112 defines a non-display region.

The organic light emitting element 200 is disposed on the first electrode 146, which is exposed by the pixel defining layer 112. The second electrode 148 covers the organic light emitting element 200 and the pixel defining layer 112.

When the display panel DP is a front illumination type, the second electrode 148 may include a transparent conductive material. Examples of the transparent conductive material that may be used for the second electrode 148 may include indium tin oxide, tin oxide, indium zinc oxide, zinc oxide, indium gallium oxide, gallium oxide, etc. These may be used alone or in a combination thereof.

The touch screen panel of FIG. 28 is similar to the touch screen panel of FIGS. 1 through 13. That is, the touch screen panel TSP may include a base substrate 310, a first protection layer 320, a first insulation layer 340, a second insulation layer 350, a second protection layer 360, a first touch electrode 331, and a second touch electrode 333. As such, duplicative descriptions have been omitted to avoid obscuring exemplary embodiments.

Figure 29:
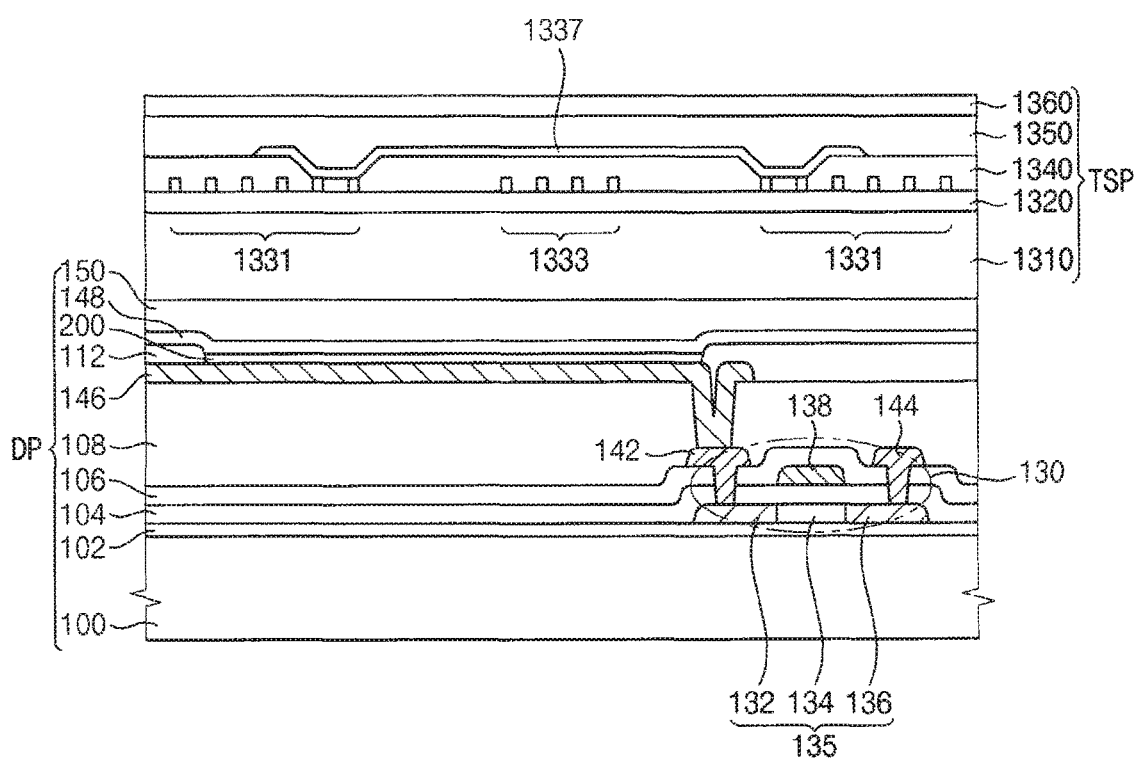
FIG. 29 is a cross-sectional view of a touch display device, according to one or more exemplary embodiments.

FIG. 29 is a cross-sectional view of a touch display device, according to one or more exemplary embodiments.

Referring to FIG. 29, a touch display device may include a display panel DP configured to display an image and a touch screen panel TSP disposed on the display panel DP. The touch display device is an organic light emitting diode touch display device, however, exemplary embodiments are not limited thereto. A display panel DP of FIG. 29 is similar to the display panel of FIG. 28, and, as such, duplicative descriptions have been omitted to avoid obscuring exemplary embodiments.

The touch screen panel TSP of FIG. 29 is similar to the touch screen panel of FIGS. 14 through 20. That is, the touch screen panel TSP may include a base substrate 1310, a first protection layer 1320, a first insulation layer 1340, a second insulation layer 1350, a second protection layer 1360, a first touch electrode 1331, a second touch electrode 1333, and a connecting electrode 1337. As such, duplicative descriptions have been omitted to avoid obscuring exemplary embodiments.

Figure 30:
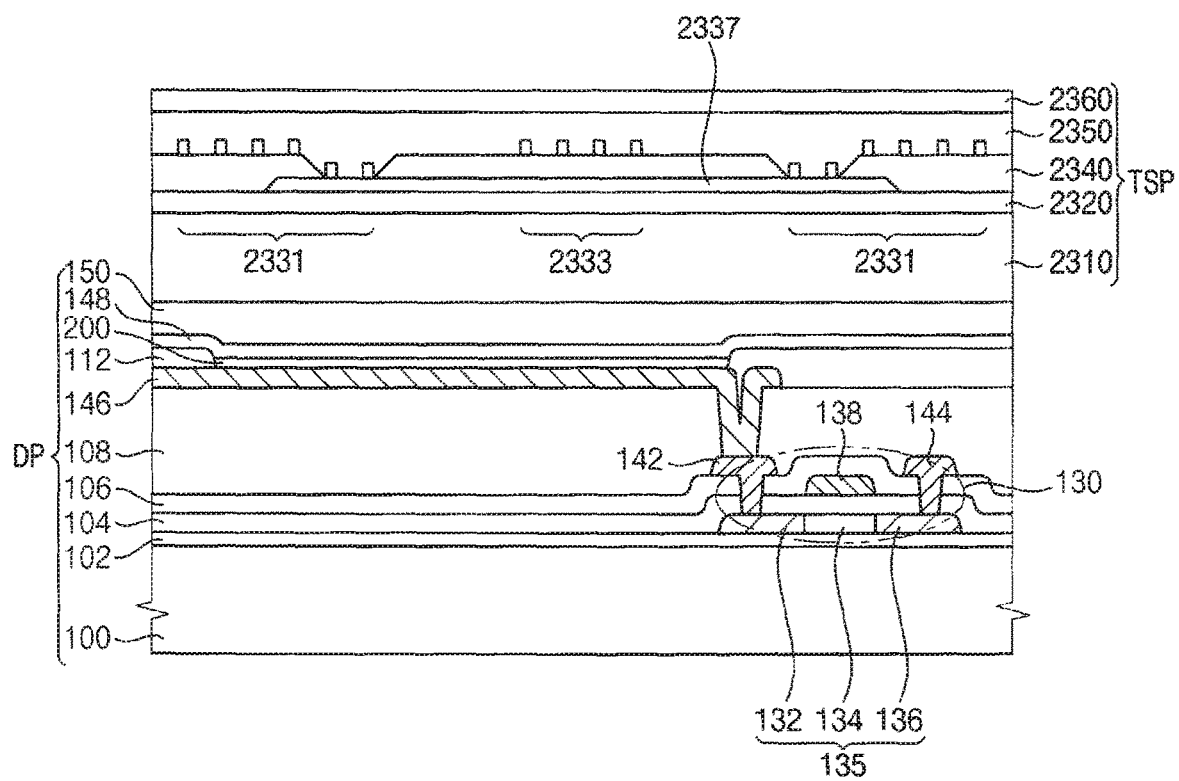
FIG. 30 is a cross-sectional view of a touch display device, according to one or more exemplary embodiments.

FIG. 30 is a cross-sectional view of a touch display device, according to one or more exemplary embodiments.

Referring to FIG. 30, the touch display device may include a display panel DP configured to display an image and a touch screen panel TSP disposed on the display panel DP. The touch display device is an organic light emitting diode touch display device, however, exemplary embodiments are not limited thereto. The display panel DP of FIG. 30 is similar to the display panels of FIGS. 28 and 29, and, as such, duplicative descriptions have been omitted to avoid obscuring exemplary embodiments.

The touch screen panel TSP of FIG. 30 is similar to the touch screen panel of FIGS. 21 through 27. That is, the touch screen panel TSP may include a base substrate 2310, a first protection layer 2320, a first insulation layer 2340, a second insulation layer 2350, a second protection layer 2360, a first touch electrode 2331, a second touch electrode 2333, and a connecting electrode 2337. As such, duplicative descriptions have been omitted to avoid obscuring exemplary embodiments.

Figure 31:
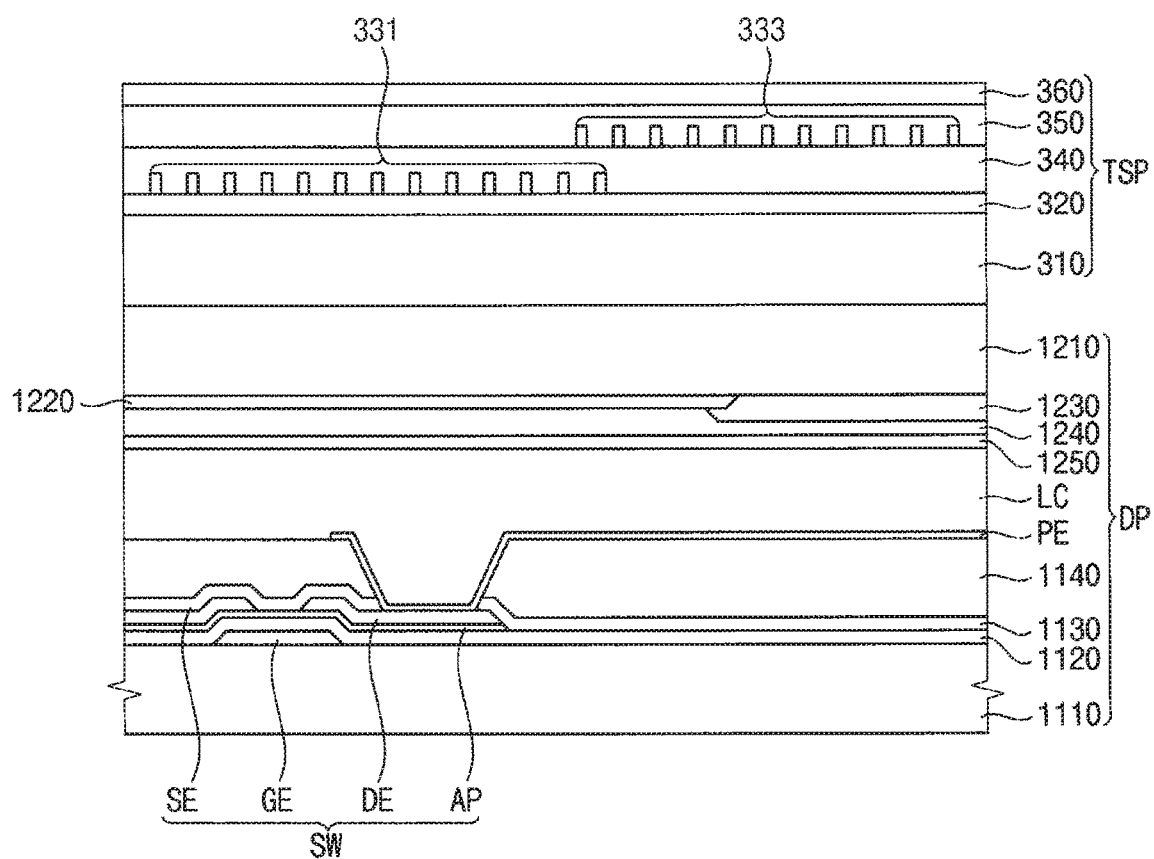
FIG. 31 is a cross-sectional view of a touch display device, according to one or more exemplary embodiments.

FIG. 31 is a cross-sectional view of a touch display device, according to one or more exemplary embodiments.

Referring to FIG. 31, a touch display device may include a display panel DP configured to display an image and a touch screen panel TSP disposed on the display panel DP. The touch display device is a liquid crystal touch display device, however, exemplary embodiments are not limited thereto.

The display panel DP includes a lower substrate 1110, a gate electrode GE, a source electrode SE, a drain electrode DE, active pattern AP, a pixel electrode PE, a first insulation layer 1120, a second insulation layer 1130, an organic layer 1140, a liquid crystal layer LC, an upper substrate 1210, a black matrix 1220, a color filter 1230, an over coating layer 1240 and a common electrode 1250.

Examples of the lower substrate 1110 may include a glass substrate, a quartz substrate, a silicon substrate, a plastic substrate, and the like.

The gate electrode GE is disposed on the lower substrate 1110. The gate electrode GE electrically connected with the gate line GL. The gate electrode GE may have a single layer structure including copper (Cu), silver (Ag), chrome (Cr), molybdenum (Mo), aluminum (Al), titanium (Ti), manganese (Mn), or a mixture thereof. In addition, the gate electrode GE may have a multi-layer structure having a plurality of layers including materials different from each other, or at least one other layer of the gate electrode GE. For example, the gate electrode GE may include a copper layer and a titanium layer disposed on and/or under the copper layer.

The first insulation layer 1120 is formed on the gate electrode GE. The first insulation layer 1120 may cover the lower substrate 1110 and a first conductive pattern including the gate electrode GE. The first insulation layer 1120 may include an inorganic material, such as silicon oxide ($SiO_x$) and/or silicon nitride ($SiN_x$). For example, the first insulation layer 1120 includes silicon oxide ($SiO_x$), and may have a thickness of about 500 Å. In addition, the first insulation layer 1120 may include a plurality of layers including different materials from each other, or at least one other layer of the first insulation layer 1120.

An active pattern AP is formed on the first insulation layer 1120. The active pattern AP is formed on the first insulation layer 1120 in an area in which the gate electrode GE is formed. The active pattern AP may be overlapped with the gate electrode GE. The active pattern AP may be partially overlapped with the source electrode SE and the drain electrode DE. The active pattern AP may be disposed between the gate electrode GE and the source electrode SE. The active pattern AP may be disposed between the gate electrode GE and the drain electrode DE.

The source electrode SE and the drain electrode DE may be formed on the active pattern AP. The source electrode SE and the drain electrode DE may be spaced apart from each other. The source electrode SE and the drain electrode DE may be formed from the same layer as the data line DL. The source electrode SE and the drain electrode DE may have a single layer structure including copper (Cu), silver (Ag), chrome (Cr), molybdenum (Mo), aluminum (Al), titanium (Ti), manganese (Mn), or a mixture thereof. In addition, the source electrode SE and the drain electrode DE may have a multi-layer structure having a plurality of layers including materials different from each other. For example, the source electrode SE and the drain electrode DE may include a copper layer and a titanium layer disposed on and/or under the copper layer.

The second insulation layer 1130 may be formed on the source electrode SE and the drain electrode DE. The second insulation layer 1130 may be formed with a material including silicon oxide ($SiO_x$) or silicon nitride ($SiN_x$).

The organic layer 1140 is disposed on the second insulation layer 1130. The organic layer 1140 planarizes an upper surface of the substrate so that issues association with a step, such as disconnection of a signal line, may be prevented. The organic layer 1140 may be an insulation layer including an organic material. The organic layer 1140 may a color filter.

The pixel electrode PE is formed on the organic layer 1140. The pixel electrode PE may be electrically connected with the drain electrode DE through a first contact hole. The pixel electrode PE may include a transparent conductive material, such as indium tin oxide (ITO) and indium zinc oxide (IZO). In addition, the pixel electrode PE may include titanium (Ti) and/or molybdenum titanium (MoTi).

Examples of the upper substrate 1210 may include a glass substrate, a quartz substrate, a silicon substrate, a plastic substrate, and the like.

The black matrix 1220 is disposed on the upper substrate 1210 on which a gate line, a data line, a gate electrode GE, a source electrode SE, and a drain electrode DE are disposed. The black matrix 1220 blocks light, and is disposed corresponding to a non-display area on which an image is not displayed.

The color filter 1230 is disposed on upper substrate 1210 on which the black matrix 1220 is disposed. The color filter 1230 supplies colors to the light passing through the liquid crystal layer LC. The color filter 1230 may include a red color filter, a green color filter, and blue color filter. The color filter 1230 corresponds to a unit pixel. The color filters 1230 adjacent to each other may have different colors. The color filter 1230 may be overlapped with adjacent color filter 1230 in a boundary of the adjacent unit pixels. In addition, the color filter 1230 may be spaced apart from adjacent color filter 1230 in the boundary of the adjacent unit pixels.

The over-coating layer 1240 is disposed on the color filter 1230 and the black matrix 1220. The over-coating layer 1240 flattens the color filter 1230, protects the color filter 1230, and insulates the color filter 1230. The over-coating layer 1240 may include acrylic-epoxy material. The common electrode 1250 is disposed on the over-coating layer 1240.

The liquid crystal layer LC is disposed between the lower substrate 1110 and the upper substrate 1210. The liquid crystal layer LC includes liquid crystal molecules having optical anisotropy. The liquid crystal molecules are driven by an electric field so that an image is displayed by passing or blocking light through the liquid crystal layer LC. In addition, the display panel DP may further include a backlight assembly providing light to the display panel DP.

The touch screen panel TSP of FIG. 31 is similar to the touch screen panel of FIGS. 1 through 13. That is, the touch screen panel TSP may include a base substrate 310, a first protection layer 320, a first insulation layer 340, a second insulation layer 350, a second protection layer 360, a first touch electrode 331, and a second touch electrode 333. As such, duplicative descriptions have been omitted to avoid obscuring exemplary embodiments.

Figure 32:
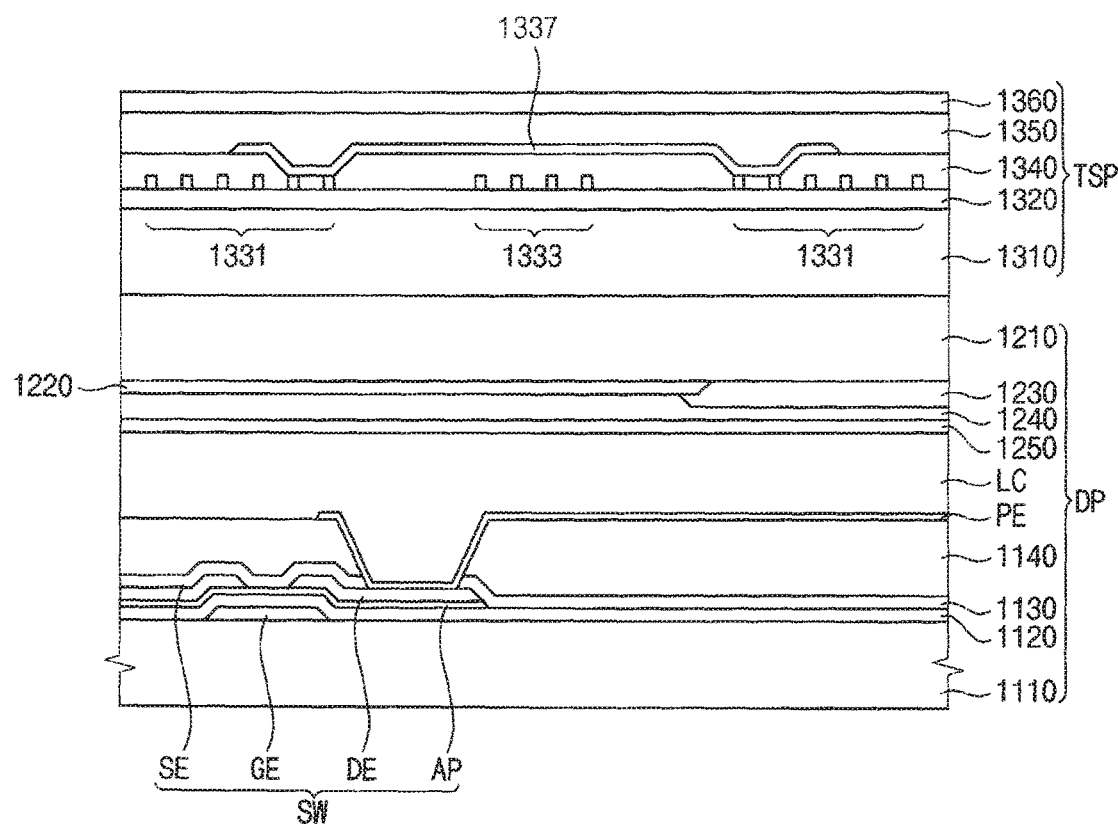
FIG. 32 is a cross-sectional view of a touch display device, according to one or more exemplary embodiments.

FIG. 32 is a cross-sectional view of a touch display device, according to one or more exemplary embodiments.

Referring to FIG. 32, a touch display device may include a display panel DP configured to display an image and a touch screen panel TSP disposed on the display panel DP. The touch display device is a liquid crystal touch display device, however, exemplary embodiments are not limited thereto. The display panel DP of FIG. 32 is similar to the display panel DP of FIG. 31, and, as such, duplicative descriptions have been omitted to avoid obscuring exemplary embodiments.

The touch screen panel TSP of FIG. 32 is similar to the touch screen panel TSP of FIGS. 14 through 20. That is, the touch screen panel TSP may include a base substrate 1310, a first protection layer 1320, a first insulation layer 1340, a second insulation layer 1350, a second protection layer 1360, a first touch electrode 1331, a second touch electrode 1333, and a connecting electrode 1337. As such, duplicative descriptions have been omitted to avoid obscuring exemplary embodiments.

Figure 33:
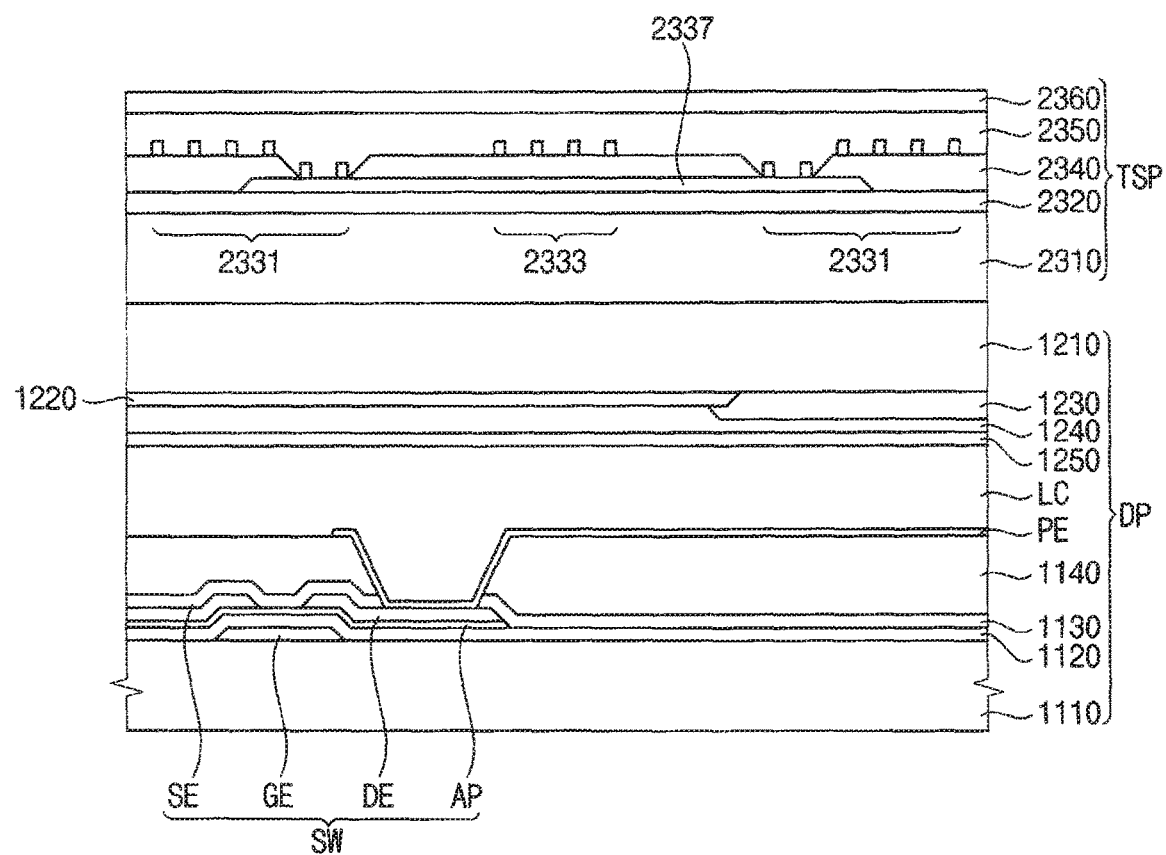
FIG. 33 is a cross-sectional view of a touch display device, according to one or more exemplary embodiments.

FIG. 33 is a cross-sectional view of a touch display device, according to one or more exemplary embodiments.

Referring to FIG. 33, a touch display device may include a display panel DP configured to display an image and a touch screen panel TSP disposed on the display panel DP. The touch display device is a liquid crystal touch display device; however, exemplary embodiments are not limited thereto. The display panel DP of FIG. 33 is similar to the display panels DP of FIGS. 31 and 32, and, as such, duplicative descriptions have been omitted to avoid obscuring exemplary embodiments.

The touch screen panel TSP of FIG. 33 is similar to the touch screen panel TSP of FIGS. 21 through 27. That is, the touch screen panel TSP may include a base substrate 2310, a first protection layer 2320, a first insulation layer 2340, a second insulation layer 2350, a second protection layer 2360, a first touch electrode 2331, a second touch electrode 2333, and a connecting electrode 2337. As such, duplicative descriptions have been omitted to avoid obscuring exemplary embodiments.

According to one or more exemplary embodiments, touch electrodes of a touch screen panel include a plurality of mesh patterns formed by crossings of metal wirings including a plurality of fine patterns. A transmissivity of the metal wirings is more than 50%. Thus, a transmissivity of a touch screen panel may be increased. In addition, the metal wirings include a plurality of fine patterns, and, as such, the metal wirings are prevented (or less) recognized as a stain by users due to reflectivity differences of metal, which may be decreased. In addition, a touch screen panel includes a first protection layer disposed between a base substrate and a first touch electrode and a second protection layer disposed on a second touch electrode. In this manner, the first protection layer may prevent damage to the base substrate.

According to one or more exemplary embodiments, the refractive index of the first protection layer may be different from a refractive index of the second protection layer. In this manner, the first protection layer and the second protection layer may compensate for decreases in transmissivity due to refractive index differences between a touch electrode and an insulation layer.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A touch screen panel comprising:
a first touch electrode disposed on a substrate and extending in a first direction, the first touch electrode comprising first mesh patterns formed of crossing metal wirings comprising fine patterns; and
a second touch electrode disposed on the substrate and extending in a second direction crossing the first direction, the second touch electrode comprising second mesh patterns formed of crossing of metal wirings comprising fine patterns,
wherein a pitch of the fine patterns of the first mesh patterns and/or the second mesh patterns is less than 150 nm.

2. The touch screen panel of claim 1, wherein a transmissivity of the metal wirings of the first mesh patterns and/or the second mesh patterns is greater than 50%.

3. The touch screen panel of claim 1, wherein:
each of the metal wirings comprises pattern portions formed of metal material and space portions disposed between the pattern portions; and
a sum of widths of the pattern portions is less than a sum of widths of the space portions.

4. The touch screen panel of claim 1, further comprising:
a first protection layer disposed between the substrate and the first touch electrode; and
a second protection layer disposed on the first touch electrode and the second touch electrode.

5. The touch screen panel of claim 4, wherein a refractive index of the first protection layer is greater than 1.7 and less than 1.8.

6. The touch screen panel of claim 5, wherein a refractive index of the second protection layer is greater than 1.6 and less than 1.75.

7. The touch screen panel of claim 6, wherein a refractive index of the first protection layer is different from a refractive index of the second protection layer.

8. The touch screen panel of claim 4, wherein the first protection layer comprises at least one material selected from the group consisting of silicon oxide ($SiO_x$), silicon nitride ($SiN_x$), and aluminum oxide ($AlO_x$).

9. The touch screen panel of claim 8, wherein the first protection layer comprises:
a first layer comprising an organic material; and
a second layer overlapping the first layer, the second layer comprising silicon oxide ($SiO_x$).

10. The touch screen panel of claim 4, wherein the second protection layer comprises at least one material selected from the group consisting of silicon oxide ($SiO_x$), silicon nitride ($SiN_x$), and aluminum oxide ($AlO_x$).

11. The touch screen panel of claim 1, wherein the first touch electrode is disposed on a different layer than the second touch electrode.

12. The touch screen panel of claim 11, further comprising:
an insulation layer insulating the first touch electrode and the second first touch electrode.

13. The touch screen panel of claim 1, wherein the first touch electrode is disposed on a same layer as the second touch electrode.

14. The touch screen panel of claim 13, wherein:
the first mesh patterns are connected with each other; and
the second mesh patterns are separated from each other.

15. The touch screen panel of claim 14, further comprising:
a connecting electrode connecting the second mesh patterns.

16. A touch display device comprising:
a display panel configured to display an image; and
a touch screen panel disposed on the display panel, the touch screen panel comprising:
    a first touch electrode disposed on a substrate and extending in a first direction, the first touch electrode comprising first mesh patterns formed of crossing metal wirings comprising fine patterns; and
    a second touch electrode disposed on the substrate and extending in a second direction crossing the first direction, the second touch electrode comprising second mesh patterns formed of crossing of metal wirings comprising fine patterns,
wherein a pitch of the fine patterns of the first mesh patterns and/or the second mesh patterns is less than 150 nm.

17. The touch display device of claim 16, wherein the display panel comprises:
a first substrate comprising a thin film transistor;
a first electrode electrically connected to the thin film transistor;
an organic light emitting diode disposed on the thin film transistor;
a second electrode covering the organic light emitting diode; and
a second substrate disposed on the second electrode.

18. The touch display device of claim 16, wherein the display panel comprises:
a first substrate comprising a thin film transistor;
a second substrate facing the lower substrate; and
a liquid crystal layer disposed between the first substrate and the second substrate.

19. A method of manufacturing a touch screen panel, the method comprising:
forming a first protection layer on a substrate;
forming, on the first protection layer, a first touch electrode extending in a first direction, the first touch electrode comprising first mesh patterns formed of crossing metal wirings comprising fine patterns, the first protection layer being, in a third direction crossing the first direction, between the first touch electrode and the substrate;
forming, on the first protection layer, a second touch electrode extending in a second direction crossing the first direction, the second touch electrode comprising second mesh patterns formed of crossing metal wirings comprising fine patterns, the first protection layer being, in the third direction, between the second touch electrode and the substrate; and
forming a second protection layer on the first touch electrode and the second touch electrode.

20. The method of claim 19, wherein a pitch of the fine patterns of the first mesh patterns and/or the second mesh patterns is less than 150 nm.

21. The method of claim 19, wherein a transmissivity of the metal wirings of the first mesh patterns and/or the second mesh patterns is greater than 50%.

22. The method of claim 19, wherein:
each of the metal wirings comprises pattern portions formed of metal material and space portions disposed between the pattern portions; and
a sum of widths of the pattern portions is less than a sum of widths of the pace portions.

23. The method of claim 19, wherein a refractive index of the first protection layer is greater than 1.7 and less than 1.8.

24. The method of claim 23, wherein a refractive index of the second protection layer is greater than 1.6 and less than 1.75.

25. The method of claim 24, wherein a refractive index of the first protection layer is different than a refractive index of the second protection layer.

26. The method of claim 19, wherein the first protection layer comprises at least one material selected from the group consisting of silicon oxide ($SiO_x$), silicon nitride ($SiN_x$), and aluminum oxide ($AlO_x$).

27. The method of claim 26, wherein the first protection layer comprises:
a first layer comprising an organic material; and
a second layer overlapping the first layer, the second layer comprising silicon oxide ($SiO_x$).

28. The method of claim 19, wherein the second protection layer comprises at least one material selected from the group consisting of silicon oxide ($SiO_x$), silicon nitride ($SiN_x$), and aluminum oxide ($AlO_x$).

29. The method of claim 19, wherein forming the first touch electrode and the second touch electrode comprises:
forming the first touch electrode on the first protection layer;
forming a first insulation layer on the first touch electrode;
forming the second touch electrode on the first insulation layer; and
forming a second insulation layer on the second touch electrode.

30. The method of claim 19, wherein forming the first touch electrode and the second touch electrode comprises:
forming the first touch electrode and the second touch electrode on the first protection layer; and
forming an insulation layer on the first touch electrode and the second touch electrode.

31. The method of claim 30, wherein:
the first mesh patterns are connected with each other; and
the second mesh patterns are separated from each other.

32. The method of claim 31, further comprising:
forming a connecting electrode connecting the second mesh patterns.

* * * * *